(12) United States Patent
Nara

(10) Patent No.: US 9,941,324 B2
(45) Date of Patent: Apr. 10, 2018

(54) SEMICONDUCTOR DEVICE, METHOD OF MANUFACTURING SEMICONDUCTOR DEVICE, PHOTODIODE ARRAY, AND IMAGING APPARATUS

(71) Applicant: NLT Technologies, Ltd., Kanagawa (JP)

(72) Inventor: Shuhei Nara, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 15/139,487

(22) Filed: Apr. 27, 2016

(65) Prior Publication Data
US 2016/0322416 A1    Nov. 3, 2016

(30) Foreign Application Priority Data

Apr. 28, 2015 (JP) ................... 2015-092286
Dec. 15, 2015 (JP) ................... 2015-244543

(51) Int. Cl.
*H01L 27/146* (2006.01)
*H01L 31/20* (2006.01)
(Continued)

(52) U.S. Cl.
CPC .. *H01L 27/14643* (2013.01); *H01L 27/14616* (2013.01); *H01L 27/14632* (2013.01);
(Continued)

(58) Field of Classification Search
CPC ................................................ H01L 31/03762
See application file for complete search history.

(56) References Cited

U.S. PATENT DOCUMENTS

2003/0201396 A1* 10/2003 Lee ................... H01L 27/14658
                                                                    250/370.09
2006/0164533 A1* 7/2006 Hsieh ................ H01L 27/14632
                                                                         348/317
(Continued)

FOREIGN PATENT DOCUMENTS

JP    2011-119692    6/2011
JP    2011-171516    9/2011
(Continued)

OTHER PUBLICATIONS

Nomura, Kenji. et al., "Defect passivation and homogenization of amorphous oxide thin-film transistor by wet O2 annealing", Applied Physics Letters, 93(2008) 192107.
(Continued)

*Primary Examiner* — Mounir Amer
(74) *Attorney, Agent, or Firm* — Young & Thompson

(57) ABSTRACT

A semiconductor device includes: a thin film transistor including an oxide semiconductor layer that is formed in an island shape and contains at least one or more elements among indium, gallium, zinc, and tin and oxygen, a source and a drain that are connected to the oxide semiconductor layer; a protective film of at least one or more layers that is formed in an upper layer of the oxide semiconductor layer, and an opening portion that is disposed in the protective film and has a position and a size for including a channel region or a back channel region of the oxide semiconductor layer; and a photodiode that is disposed in an upper layer upper than the oxide semiconductor layer of the thin film transistor and includes a hydrogenated amorphous silicon layer.

16 Claims, 15 Drawing Sheets

(51) Int. Cl.
  *H01L 31/0376* (2006.01)
  *H01L 29/66* (2006.01)
  *H01L 29/786* (2006.01)
  *H01L 29/24* (2006.01)

(52) U.S. Cl.
  CPC .. *H01L 27/14687* (2013.01); *H01L 27/14689* (2013.01); *H01L 29/24* (2013.01); *H01L 29/66969* (2013.01); *H01L 29/7869* (2013.01); *H01L 29/78606* (2013.01); *H01L 31/03762* (2013.01); *H01L 31/202* (2013.01)

(56) References Cited

U.S. PATENT DOCUMENTS

| | | | | |
|---|---|---|---|---|
| 2007/0210257 | A1* | 9/2007 | Masuda | G01T 1/2018 250/370.09 |
| 2010/0025679 | A1* | 2/2010 | Yamazaki | H01L 27/1225 257/43 |
| 2010/0035379 | A1* | 2/2010 | Miyairi | H01L 27/1225 438/104 |
| 2011/0084269 | A1* | 4/2011 | Yamazaki | H01L 29/7869 257/43 |
| 2011/0108833 | A1 | 5/2011 | Yamazaki et al. | |
| 2011/0309876 | A1* | 12/2011 | Terai | H01L 29/7869 327/534 |
| 2012/0061578 | A1* | 3/2012 | Lim | G01T 1/2928 250/370.14 |
| 2015/0332621 | A1* | 11/2015 | Tsai | G11C 19/184 377/64 |

FOREIGN PATENT DOCUMENTS

| | | |
|---|---|---|
| JP | 2012-049209 | 3/2012 |
| JP | 5569780 | 8/2014 |

OTHER PUBLICATIONS

Gosain, Dharam Pal. et al., "Instability of Amorphous Indium Gallium Zinc Oxide Thin Film Transistors under Light Ilumination" Japanese Journal of Applied Physics, 48(2009) 03B018.

Liu, Shou-En et al., "Influence of Passivation Layers on Characteristics of a—InGaZnO Thin-Film Transistors" IEEE Electron Device Letters, vol. 32, No. 2, Feb. 2011, pp. 161-163.

* cited by examiner

SEMICONDUCTOR DEVICE, METHOD OF MANUFACTURING SEMICONDUCTOR DEVICE, PHOTODIODE ARRAY, AND IMAGING APPARATUS

CROSS-REFERENCE TO RELATED APPLICATIONS

This non-provisional application claims priority under 35 U.S.C. § 119(a) on Patent Application No. 2015-092286 filed in Japan on Apr. 28, 2015, and Patent Application No. 2015-244543 filed in Japan on Dec. 15, 2015, the entire contents of which are hereby incorporated by reference.

FIELD

The present invention relates to a semiconductor device using oxide semiconductor and more particularly, to a photodiode array and an imaging apparatus.

BACKGROUND

A photodiode array is a device in which semiconductor devices each formed by connecting a thin film transistor (hereinafter, referred to as a TFT) and a photodiode are aligned in a matrix pattern. Oxide semiconductor is used as an alternative material for amorphous silicon semiconductor that is used for TFTs included in a photodiode array.

In other words, a photodiode array is one type of image sensor, and an element thereof is formed by a photodiode formed using hydrogenated amorphous silicon and a TFT. In the mechanism thereof, photoelectric conversion of light is performed using the photodiode, and acquired electric charge is read from a signal line through the TFT. Particularly, the TFT is required to have high off-resistance for preventing leakage of generated electric charge and low on-resistance for easily moving electric charge to the signal line at the time of reading the electric charge. Thus, recently, a photodiode array in which oxide semiconductor as a material having a high on/off ratio is mounted receives a lot of attention.

The oxide semiconductor is one type of semiconductor configured by a metal cation and an oxide ion. In the oxide semiconductor, oxide ions form a valence band, and a metal cation forms a conduction band. Thus, here, in a case where the oxide ions come out, remaining electrons present in a remaining site after the oxide ions come out move from the valence band to the conduction band, thereby electricity flows. At this time, the remaining site after the coming-out of the oxide ions is called oxygen vacancy. In other words, the oxygen vacancy serves as a donor, and, as the oxygen vacancy increases, the density of electrons flowing through the conduction band increases, whereby sheet resistance of the oxide semiconductor decreases. In addition, it is known that the conductivity increases in a case where hydrogen is introduced into oxide semiconductor (see U.S. Pat. No. 5,569,780). Furthermore (see Nomura, K. et al. Applied Physics Letters, 93 (2008) 192107), it is represented that, in a case where annealing is performed in oxygen atmosphere containing water vapor, as the humidity is higher, the mobility is improved more, and a threshold shift and an S value decrease. Here, the S value is also called sub-threshold swing value and represents a switching characteristic of a transfer characteristic. The smaller the S value is, the better the rising is. In addition, in Nomura, K. et al. Applied Physics Letters, 93 (2008) 192107, it has been disclosed that, in a case where an anneal gas is changed from a nitrogen gas to an oxygen gas, an increase in the density of oxygen vacancy is suppressed, and an excessive rise of the electric conductivity can be suppressed. Furthermore, it is known that, in a case where hydrogen penetrates into an oxide semiconductor layer, the sheet resistance of the oxide semiconductor decreases (see Gosain, D. P. et al. Japanese Journal of Applied Physics, 48 (2009) 03B018). As disclosed in such prior art documents, by introducing specific gas molecules, the electric characteristics of the oxide semiconductor diversely change.

However, there is a problem in the oxygen vacancy that the density easily changes also after film formation. A change in the density of oxygen vacancy influences the property of the oxide semiconductor. For example, also in a case where specific gas processing is not performed, in the oxide semiconductor, hydrogen and oxygen easily go in or out according to the heat, and, in a case where a membrane stress is received, oxygen vacancy generation energy increases or decreases according to the type of the stress such as a compressive stress or a tensile stress, and a threshold is shifted. In this way, the oxide semiconductor is quite sensitive to a component contained in the film or a surrounding environment (see Liu, S.-E. et al. IEEE Electron Device Letters, Vol 32, No 2, February 2011, 161). In a case where IGZO is used in the oxide semiconductor, relating to the diffusion or penetration of hydrogen or oxygen to the inside or outside of the film that is a problem of the former, it has been disclosed that (see JP 2012-49209 A), by increasing the ratio of gallium having high binding energy for oxygen, the discharge of oxygen to the outside of the film can be suppressed. However, a solution for the membrane stress that is a problem of the latter has not been reported until now. For this reason, in order to decrease the membrane stress, the material of the protective film is limited to a material having a low membrane stress, and the number of stacked layers and the film thickness are restricted, whereby a burden on the design increases.

In addition, by combining an oxide semiconductor TFT and a photodiode, another problem occurs. The problem is that, when a film of amorphous silicon is formed thick, a large amount of hydrogen plasma is generated. FIG. 1 is a cross-sectional view of the element structure of a conventional photodiode array. Here, as illustrated in FIG. 1, in a case where an oxide semiconductor TFT is built in a photodiode array, a hydrogen concentration or an oxygen vacancy density of the inside of the oxide semiconductor film changes at the time of forming an amorphous silicon film of an upper layer changes, and the semiconductor characteristic is changed. In other words, for example, as illustrated in the prior art document 1, the hydrogen concentration of the inside of the oxide semiconductor layer increases, and there are cases where the off-characteristic of the TFT is degraded. FIG. 2 is a graph that illustrates the transfer characteristic of a TFT using oxide semiconductor according to a conventional technology 1. In FIG. 2, the vertical axis represents the drain current, and the unit thereof is ampere (A). In FIG. 2, the horizontal axis is the gate voltage, and the unit thereof is volt (V). As illustrated in FIG. 2, in a test described in the prior art document 1, in a case where hydrogen plasma is emitted in the state of an initial characteristic A having high hysteresis, as denoted by "B", the off-characteristic is not represented. Meanwhile, when a photodiode is formed as a film after the formation of the oxide semiconductor as a film, a large amount of hydrogen generated at the time of chemical vapor deposition (hereinafter, referred to as CVD) film formation is accumulated in a protective film disposed between an oxide semiconductor layer and a hydrogenated amorphous silicon layer, and a part thereof arrives up to the oxide semiconductor layer. For this reason, hydrogen arriving up to the oxide semiconductor layer degrades the initial characteristic, hydrogen accumulated in the protective film gradually diffuses according to the heat and finally penetrates into the oxide semiconductor layer, thereby degrading the reliability. Accordingly, the semiconductor characteristic may be easily caused to be in the situation as denoted by "B" illustrated in FIG. 2.

A first countermeasure for such a problem is based on a characteristic recovery property of the oxide semiconductor. For example, in the prior art document 1, it has been checked that, by performing a steam treatment of oxide semiconductor that is in the state B, as denoted by a characteristic C, the off-characteristic is recovered. Thus, there is a possibility that the characteristic of oxide semiconductor, which has been degraded once, is recovered by performing appropriate post-processing such as gas annealing. However, in the conventional technology, there is no case where post-processing for enhancing the characteristic of an oxide semiconductor layer is performed after forming protective films stacked thick like first to third protective films 7 to 14 illustrated in FIG. 1. The reason for this is that, even in a case where gas annealing is performed from above thick protective films, a quite long diffusion time is required for a gas to arrive at and penetrate into an oxide semiconductor layer that is a target for recovering the characteristic, and accordingly, the efficiency is low. In addition, it is difficult for gas molecules, particularly, having a large molecular size to permeate the oxide semiconductor layer, and accordingly, an effect of the gas annealing cannot be acquired. In a structure, in which a photodiode is arranged on an upper layer of the oxide semiconductor layer, assumed in the present application, in addition to a protective film for the oxide semiconductor, a protective film for the photodiode is required as well. Thus, many layers are present as upper layers of the oxide semiconductor layer, whereby a thick film is formed. Therefore, according to the conventional technology, it is difficult to solve the problem described above.

A second countermeasure plan is to arrange a protective film that prevents hydrogen from penetrating into oxide semiconductor. However, hydrogen plasma and a hydrogen molecule have extremely small particle sizes and can easily pass through a general silicon oxide film (hereinafter, also referred to as a SiOx film) or a silicon nitride film (hereinafter, also referred to as a SiNx film) and cannot be blocked. Thus, in a case where the oxide semiconductor is formed as a film before hydrogenated amorphous silicon, it is difficult to prevent the penetration of hydrogen.

A third countermeasure plan is a method in which a photodiode is formed as a film first, and oxide semiconductor is formed as a film later.

However, such a method has problems 1, 2, and the like described below.
1. In order to acquire a good oxide semiconductor characteristic, high-temperature annealing is required, and in a thick photodiode layer, the high-temperature annealing causes peeling.
2. Since the photodiode layer is arranged in a lower layer, the number of stacked films of the upper layer increases, and the amount of light arriving at the photodiode decreases, thereby causing the degradation of quantum efficiency.

Here, the quantum efficiency is a photoelectric conversion ratio, and, as this value is larger, the photosensitivity is superior.

The problems can be summarized as below.
Problem of Membrane Stress
1-1. The threshold of the TFT is not stabilized due to the influence of a membrane stress.
1-2. A film having a high membrane stress cannot be formed in an upper layer of the oxide semiconductor layer.
Problem Occurring Due to Combination with Photodiode
2-1. The off-characteristic is degraded due to hydrogen generated at the time of forming photodiode films.
2-2. In a case where a photodiode is arranged in a lower layer, other problems occur.

An object of the present invention is to provide a semiconductor device enabling the recovery of initial characteristics and reliability of oxide semiconductor, which is degraded due to the influence of hydrogen generated after formation of an oxide semiconductor layer, without arranging a photodiode in a lower layer.

SUMMARY

According to an aspect of the embodiment, a semiconductor device includes a thin film transistor including an oxide semiconductor layer that is formed in an island shape and contains at least one or more elements among indium, gallium, zinc, and tin and oxygen, a source and a drain that are connected to the oxide semiconductor layer, a protective film of at least one or more layers that is formed in an upper layer of the oxide semiconductor layer, and an opening portion that is disposed in the protective film and has a position and a size for including a channel region or a back channel region of the oxide semiconductor layer and a photodiode that is disposed in an upper layer upper than the oxide semiconductor layer of the thin film transistor and includes a hydrogenated amorphous silicon layer.

According to an aspect of the embodiment, by configuring a structure for opening a protective film disposed right above a channel region or a back channel region of oxide semiconductor, the number of stacked films covering an upper layer of the oxide semiconductor is suppressed to have a low stress, and, by performing a process enhancing the characteristics of the oxide semiconductor after further opening, a semiconductor device having good initial characteristics of the oxide semiconductor and high reliability can be provided.

DESCRIPTION OF EMBODIMENTS

Embodiment 1

Configuration of Embodiment 1

Figure 3:
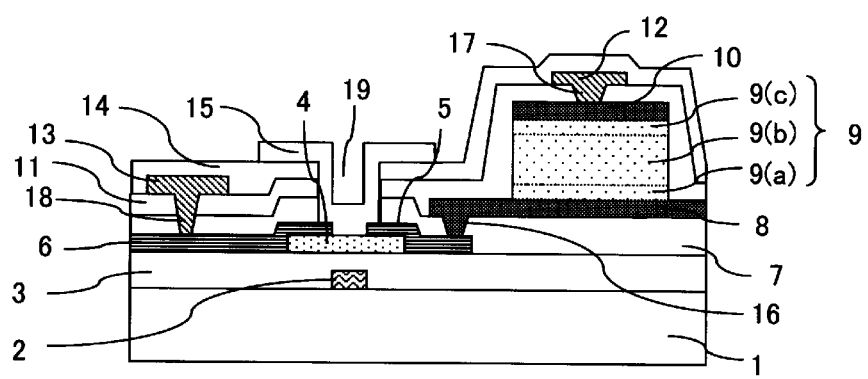
FIG. 3 is a cross-sectional view of the element structure of a semiconductor device according to Embodiment 1 of the present invention.
Figure 4:
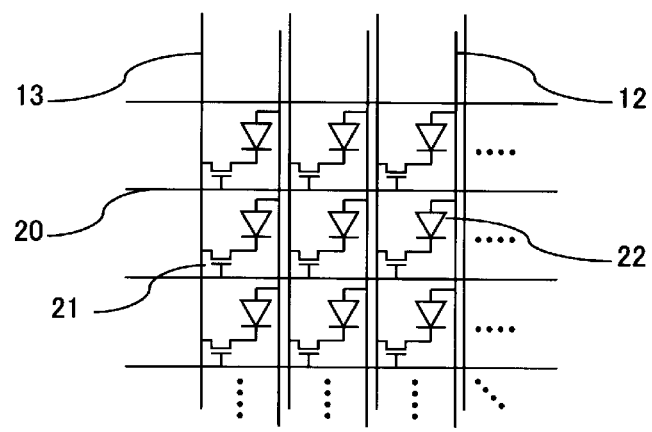
FIG. 4 is a plan view that schematically illustrates the circuit of a photodiode array.

FIG. 3 is a cross-sectional view of the element structure of a semiconductor device according to Embodiment 1 of the present invention. FIG. 4 is a plan view that schematically illustrates the circuit of a photodiode array. The element structure illustrated in FIG. 3 will be described. In an upper layer of an oxide semiconductor layer 4, a source electrode 5 and a drain electrode 6 of a TFT are formed to be separated by a channel length, and, right below the oxide semiconductor layer 4, a gate electrode 2 is present with a gate insulating film 3 interposed therebetween. Under the gate electrode 2, a substrate 1 is present, and the substrate 1 is arranged in a lowermost layer. The TFT is directly in contact with and coated with a first protective film 7. A photodiode has a structure in which a lower electrode 8, a hydrogenated amorphous silicon layer 9, and an upper electrode 10 are continuously stacked. The hydrogenated amorphous silicon layer 9 is formed further by stacking an n+ hydrogenated amorphous silicon layer 9(a), an intrinsic hydrogenated amorphous silicon layer 9(b), and a p+ hydrogenated amorphous silicon layer 9(c) in the mentioned order from further below. The photodiode is arranged right on the first protective film 7 and is directly in contact with and coated with a second protective film 11. The source electrode 5 of the TFT and the lower electrode 8 of the photodiode are connected through a first contact hole 16 formed in the first protective film 7. The gate electrode 2 is formed to be continuous from a gate line 20 illustrated in FIG. 4. The drain electrode 6 is connected to a signal line 13 through a third contact hole 18 formed in the first protective film 7 and the second protective film 11. In addition, the upper electrode 10 is connected to a bias line 12 through a second contact hole 17 formed in the second protective film 11. The signal line 13 and the bias line 12 are formed on the second protective film 11 and are coated with a third protective film 14. An opening portion 19 that is a feature of the present invention is formed for all the protective films present on the right upper side of the TFT or for at least the first protective film 7. The opening portion 19 is open in a range broader than a channel portion including the channel portion of the oxide semiconductor layer 4. In other words, the opening portion 19 has a position and a size including the channel region or the back channel region of the oxide semiconductor layer 4. However, the opening portion 19 is not formed at a position at which the upper electrode 10 or the hydrogenated amorphous silicon layer 9 is arranged. Thus, right above the channel region of the oxide semiconductor layer 4, the photodiode is not arranged. The depth of the opening portion 19 is of a degree for which the oxide semiconductor layer 4, the source electrode 5, and the drain electrode 6 are exposed. When the opening portion 19 is formed, the oxide semiconductor layer 4 or the source electrode 5 and the drain electrode 6 are required not to be lost. After the formation of the opening portion 19 and post-processing to be described later are performed, the opening portion 19 is coated with a fourth protective film 15, and nothing is present in an upper layer positioned on a further upper side than the fourth protective film 15.

The circuit diagram of the photodiode array illustrated in FIG. 4 will be described. Elements each formed by connecting a TFT 21 and a photodiode 22 are arranged in the vertical and horizontal directions in a matrix pattern. Between the elements or in an upper layer of the elements, gate lines 20, signal lines 13, and bias lines 12 are arranged. Each gate line 20 is arranged in the horizontal direction, each signal line 13 and each bias line 12 are arranged in the vertical direction, and the gate lines 20 and the signal lines 13 and the bias lines 12 are arranged to be orthogonal to each other. Each signal line 13 and each bias line 12 are arranged to at an interval. The gate line 20, the signal line 13, and the bias line 12 are respectively connected to a gate electrode 2 of each element, a drain electrode 6 of each element, and an upper electrode 10 of each element. The number of gate lines 20 is the same as the number of elements arranged in the vertical direction, and elements of horizontal one column are connected to a same gate line 20. The number of the signal lines 13 and the number of the bias lines 12 are the same as the number of elements arranged in the horizontal direction, and elements of vertical one column are connected to a same signal line 13 and a same bias line 12. Thus, for a certain element, there is not any element connected to the same gate line 20, the same signal line 13, and the same bias line 12 as those of the element.

Figure 5:
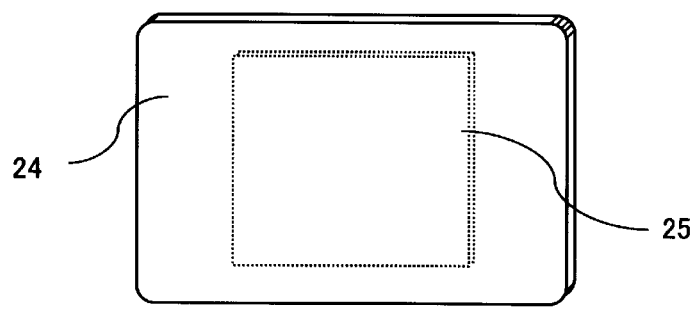
FIG. 5 is a schematic diagram that illustrates an actual use form of a photodiode array substrate and an imaging apparatus.
Figure 6A:
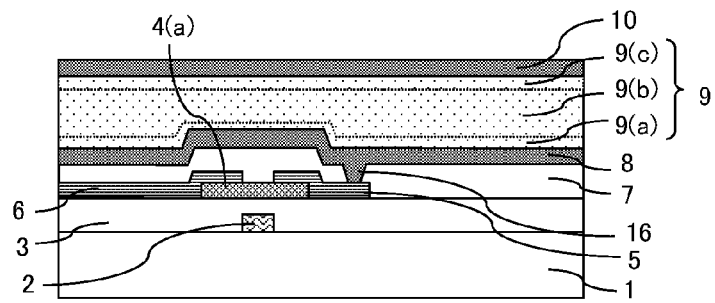
FIGS. 6A to 6D are diagrams that illustrate the process flow according to Embodiment 1 of the present invention.
Figure 6B:
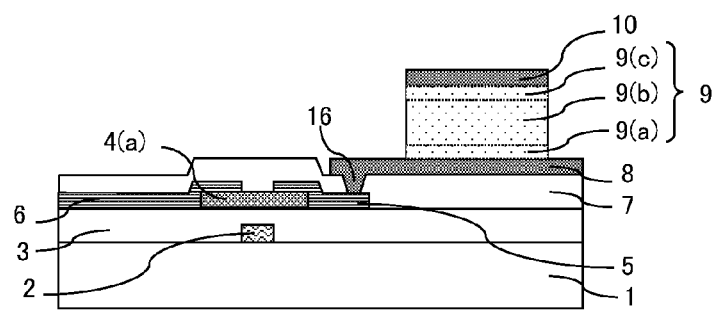
Figure 6C:
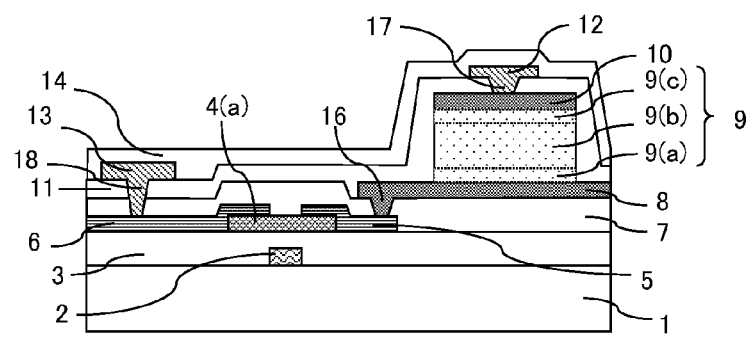
Figure 6D:
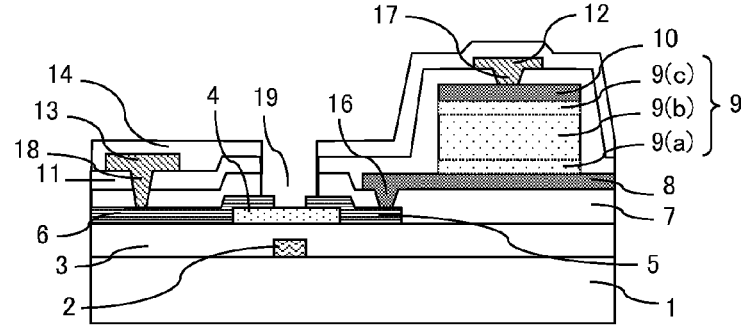

FIG. 5 is a schematic diagram that illustrates an actual use form of a photodiode array substrate and an imaging apparatus. In the photodiode array substrate 25, the circuit of the photodiode array illustrated in FIG. 4 is patterned, and an upper layer of the photodiode array is coated with phosphor (scintillator) converting radiation of cesium iodide (CsI) or the like into visible light. The imaging apparatus 24 stores the photodiode substrate on the inside thereof and uses the photodiode substrate, whereby detection of radiation and imaging can be performed.

Description of Operation According to Embodiment 1

Next, a method of manufacturing a photodiode array according to the present invention will be described. FIGS. 6A to 6D illustrate cross-sectional views during the process of manufacturing the semiconductor device according to Embodiment 1.

On the upper face of a substrate 1, a gate electrode 2 is formed. A metal material is formed as a film on the substrate 1 formed using glass, polyimide, or the like, and the formed film is patterned into the shape of an electrode. The metal material used for the gate electrode 2 is metal containing at least one or more of Al, Ni, Mo, Ti, Cr, Ta, W, Zn, Cu, In, Au, La, Nb, and Nd or an alloy thereof.

A gate insulating film 3 is formed such that the entire gate electrode 2 is coated therewith. The gate insulating film 3 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film having low hydrogen concentration of the other film and suppressing diffusion and penetration of water or hydrogen into the oxide semiconductor layer 4. In addition, while it is not necessary, a material that is difficult to etch at the time of opening the first protective film 7 later is preferably selected for the gate insulating film 3 from among the materials described above.

In an upper layer of the gate insulating film 3, an oxide semiconductor layer 4 is formed in an island shape. Here, oxide semiconductor represents a compound exhibiting the characteristic of a semiconductor formed by at least one or more of In, Ga, Zn, and Sn and oxygen. After the oxide semiconductor layer 4 is patterned, annealing of 250° C. or higher is performed for the oxide semiconductor layer 4.

In an upper layer of the oxide semiconductor layer 4, a source electrode 5 and a drain electrode 6 are formed to be separated from each other by a channel length. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4 and is difficult to etch as the source electrode 5 and the drain electrode 6 at the time of opening the first protective film 7 later is selected from among the materials described above. In addition, as the material of the oxide semiconductor layer 4, a metal material that is difficult to etch at the time of patterning the source electrode 5 and the drain electrode 6 is selected from among the materials described above. Alternatively, an etchant that cannot easily etch the oxide semiconductor layer 4 at the time of patterning the source electrode 5 and the drain electrode 6 is used. For example, in a case where the source electrode 5 and the drain electrode 6 are formed using Cu, wet etching is performed using a weak acid such as an acetic acid mixture.

After the formation of the source electrode 5 and the drain electrode 6, the first protective film 7 with which the TFT is coated is formed. The first protective film 7 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4.

After the formation of the first protective film 7, a first contact hole 16 used for connecting the lower electrode 8 and the drain electrode 6 later is formed in the first protective film 7. The first contact hole 16 is formed in a part disposed right above the source electrode 5, and the source electrode 5 is partly exposed by forming the first contact hole 16.

After the formation of the first protective film 7, the lower electrode 8 is formed as a film. A metal material used for the lower electrode 8 is metal including at least one or more of Al, Ni, Mo, Ti, Cr, Ta, W, Zn, Cu, In, Au, La, Nb, and Nd or an alloy thereof, and a material having low contact resistance with the drain electrode 6 is selected. The lower electrode 8 is patterned so as not to cover at least the channel region of the TFT.

After the formation of the lower electrode 8, a hydrogenated amorphous silicon layer 9 is formed as a film. The hydrogenated amorphous silicon layer 9 has a structure in which an n+ hydrogenated amorphous silicon layer 9(*a*), an intrinsic hydrogenated amorphous silicon layer 9(*b*), and a p+ hydrogenated amorphous silicon layer 9(*c*) are stacked in the mentioned order from the below. The hydrogenated amorphous silicon layer 9 is formed as a film through CVD of 250° C. or lower using any one of $SiH_4$, $RSiH_3$, $R_2SiH_2$, and $R_3SiH$ as its material (here, R is a substituent other than H). Other than silicon and hydrogen, a phosphorus compound is contained in the n+ hydrogenated amorphous silicon layer 9(*a*), and a boron compound is contained in the p+ hydrogenated amorphous silicon layer 9(*c*). In the hydrogenated amorphous silicon layer 9, the intrinsic hydrogenated amorphous silicon layer 9(*b*) is the thickest and is formed to have a thickness of about 0.5 μm to 2.0 μm. In a case where the film thickness of the intrinsic hydrogenated amorphous silicon layer 9(*b*) is less than 0.5 μm, the quantum efficiency of the photodiode is decreased, and a risk of increasing a dark current is increased. After the formation of the hydrogenated amorphous silicon layer 9 as a film, the oxide semiconductor layer 4 is changed to an altered oxide semiconductor layer 4(*a*).

After the formation of the hydrogenated amorphous silicon layer 9 as a film, an upper electrode 10 is formed as a film. The upper electrode 10 is a transparent conductive film of ITO or the like that is formed by at least one or more of In, Ga, Zn, and Sn and oxygen. In a case where the film thickness is large, the transmission amount of light decreases, which leads to a decrease in the quantum efficiency, and thus, the upper electrode 10 is formed as a film to have a thickness of 200 nm or less.

After the formation of the upper electrode 10 as a film, the upper electrode 10 and the hydrogenated amorphous silicon layer 9 are respectively etched in the mentioned order. The upper electrode 10 and the hydrogenated amorphous silicon layer 9 can be patterned using a same mask, and the same pattern or an island pattern in which the upper electrode 10 is slightly smaller than that hydrogenated amorphous silicon layer 9 is formed.

A second protective film 11 is formed to have a thickness of 0.2 to 3.0 µm so as to cover at least the upper electrode 10 and the hydrogenated amorphous silicon layer 9. However, in order to decrease parasitic capacitance formed by the gate line 20 and a signal line 13 and a bias line 12 formed later, the second protective film 11 preferably has a large film thickness as possibly as can. The second protective film 11 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4.

After the formation of the second protective film 11, a second contact hole 17 used for connecting the upper electrode 10 and a bias line 12 to be formed later and a third contact hole 18 used for connecting the drain electrode 6 and a signal line 13 to be formed later are formed. The second contact hole 17 is formed in a portion right above the upper electrode 10, and the second protective film 11 is removed by forming the second contact hole 17, whereby the upper electrode 10 is partly exposed. The third contact hole 18 is formed in a portion right above the drain electrode 6, and the first protective film 7 and the second protective film 11 are removed by forming the third contact hole 18, whereby the drain electrode 6 is partly exposed.

After the formation of the second contact hole 17 and the third contact hole 18, a bias line 12 and a signal line 13 are formed. The bias line 12 and the signal line 13 can be simultaneously patterned using a same mask. A metal material used by the bias line 12 and the signal line 13 is metal containing at least one or more of Al, Ni, Mo, Ti, Cr, Ta, W, Zn, Cu, In, Au, La, Nb, and Nd or an alloy thereof. As the material of the bias line 12, a material having low contact resistance with the upper electrode 10 is selected, and, as the material of the signal line 13, a material having low contact resistance with the drain electrode 6 is selected. The bias line 12 is arranged to be formed right above the second contact hole 17, and the signal line 13 is formed to be arranged right above the third contact hole 18.

After the formation of the signal line 13 and the bias line 12, a third protective film 14 is formed to have a thickness of 0.2 to 3.0 µm so as to cover at least the signal line 13 and the bias line 12. The third protective film 14 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4.

After the formation of the third protective film 14, an opening portion 19 is formed. The opening portion 19 is positioned right above the oxide semiconductor layer 4 and partly removes the first protective film 7 to the third protective film 14 such that the back channel region of the TFT is exposed. The size of the opening portion 19 is configured to include the back channel region of the oxide semiconductor layer 4 and be large. However, the opening portion 19 is configured to have a position, a size, and a depth such that the lower electrode 8, the hydrogenated amorphous silicon layer 9, the upper electrode 10, the gate line 20, the signal line 13, and the bias line 12 are not exposed. When the opening portion 19 is formed, an etchant that can easily etch the first protective film 7 to the third protective film 14 but cannot easily etch the oxide semiconductor layer 4, the source electrode 5, and the drain electrode 6, and more preferably, the gate insulating film 3 is selected and used. For example, in a case where the first protective film 7 is configured by a silicon nitride film or a silicon oxide film, and the source electrode 5 and the drain electrode 6 are formed using Al or Cr, plasma etching is performed using a fluorine-based gas.

After the formation of the opening portion 19, post-processing for enhancing the semiconductor characteristic is performed for the altered oxide semiconductor layer 4(*a*). The post-processing that is assumed represents, in addition to thermal annealing (heating process) in the atmosphere for detaching oxygen and hydrogen, placement under reduced pressure, and pressure-reduced annealing, a process using a gas having a property for introducing oxygen and increasing the membrane resistance of the oxide semiconductor or a mixed gas thereof, a gas changing the oxygen concentration by detaching oxygen and lowering the membrane resistance of the oxide semiconductor or a mixed gas thereof, an oxidizing gas and a reducing gas having a property being capable of giving/receiving electrons to/from the oxide semiconductor layer 4(*a*) without exchanging oxygen and changing the electron density of the oxide semiconductor or a mixed gas thereof. Here, water vapor, oxygen, ozone, hydrogen peroxide, dinitrogen oxide, oxygen radical, a simple substance halogen having a vapor phase, and the like correspond to the gas increasing the membrane resistance of the oxide semiconductor by introducing oxygen or lowering the electron density. In addition, carbon monoxide, sulfur dioxide, sulfur hydrogen, and the like correspond to the gas decreasing the membrane resistance of the oxide semiconductor by detaching oxygen or raising the electron density. A process described here is standing, heating, or a plasma process. However, a process using a substance acting as an etchant of the oxide semiconductor layer 4 or the source electrode 5 and the drain electrode 6 among the substances corresponding to the description presented above is excluded from the post-processing. The altered oxide semiconductor layer 4(*a*) is post-processed and then is reformed into the oxide semiconductor layer 4.

After the opening portion 19 is formed, and the post-processing for enhancing the semiconductor characteristic is performed, a fourth protective film 15 that protects the oxide semiconductor layer 4 is formed. The fourth protective film 15 is configured as a single layer or a stacked film including any one of a SiOx film, a SiON film, an $Al_2O_3$ film, a $TiO_2$ film, a $Y_2O_3$ film, an ATO film, a high-impurity SiNx film having low hydrogen concentration, and an insulating film having low hydrogen concentration of the other film and suppressing diffusion and penetration of water or hydrogen into the oxide semiconductor layer 4, and a film quality and a film thickness for low stress are selected and set. In addition, for a thin film having the same material, the membrane stress can be adjusted by using a film formation condition.

The configuration of a radiation imaging apparatus that is an application of Embodiment 1 will be described with reference to FIGS. 4 and 5.

As illustrated in FIG. 5, the photodiode array substrate 25 is used with being stored inside the imaging apparatus 24. In the photodiode array substrate, the circuit of the photodiode array illustrated in FIG. 4 is patterned, and the upper layer of the photodiode array is coated with phosphor (scintillator) converting radiation of cesium iodide (CsI) or the like into visible light.

Description of Effect of Embodiment 1

The effects of Embodiment 1 will be described with reference to FIG. 3. As a direct effect of removing the protective film disposed on the upper side of the oxide semiconductor layer 4, a threshold shift of the semiconductor according to the membrane stress can be enhanced. According to the present invention, since the third protective film 14 is removed from the first protective film 7 disposed in the upper layer of the oxide semiconductor layer 4, the membrane stress applied to the oxide semiconductor layer 4 in the process of the opening is released once. Accordingly, for the first protective film 7 to the third protective film 14, the membrane stress does not need to be considered in design, and only the membrane stress of the fourth protective film 15 may be considered, and the design restriction is alleviated.

In addition, like the photodiode array considered this time, also in a case where the hydrogenated amorphous silicon layer 9 is formed after the formation of the oxide semiconductor TFT, there is an effect according to the opening. When a thick hydrogenated amorphous silicon layer 9 is formed as a film, a large amount of hydrogen contained in $SiH_4$ or the like of the raw material is formed as hydrogen plasma, and the hydrogen plasma is introduced into the oxide semiconductor layer 4 or the first protective film 7 of the upper layer, and hydrogen accepted in the oxide semiconductor degrades the initial characteristic. In addition, particularly, hydrogen introduced into an area of the first protective film 7 that is close to the oxide semiconductor layer 4 diffuses and penetrates into the oxide semiconductor layer 4 over time, and accordingly, the characteristic of the oxide semiconductor is gradually degraded. However, after the formation of the hydrogenated amorphous silicon layer 9 as a film, at least the first protective film 7 is formed as a film in advance, and accordingly, even when the steam treatment illustrated in the prior art document 1 is performed, it is difficult to acquire an effect, and the process disclosed in the prior art document 1 cannot respond to hydrogen remaining in the first protective film 7. In such a case, from a state in which a plurality of layers are deposited in the upper layer of the oxide semiconductor layer 4, the opening portion 19 is formed to remove the protective film, whereby gas molecules used for the post-processing are in contact with the oxide semiconductor layer 4 and diffuse thereto. Alternatively, the entrance/exit of gas molecules generated from the oxide semiconductor is made easy, and the semiconductor characteristic of the oxide semiconductor can be adjusted. Thus, according to the present invention, also after the formation of the third protective film 14 as a film, the characteristic enhancement of the oxide semiconductor according to the post-processing can be effectively performed. Particularly, it is difficult for gas molecules having a large molecular size to permeate the stacked films and act on the semiconductor layer, and thus, according to the present invention, such large gas molecules can be applied to the gas annealing of the post-processing as well. In addition, the first protective film 7 of which the hydrogen concentration has been raised according to the formation of the hydrogenated amorphous silicon layer 9 as a film is removed, and accordingly, the hydrogen concentration near the channel region is decreased. For this reason, the long-time and continuous penetration of hydrogen decreases, whereby the reliability is also improved. In addition, the entrance/exit of gas molecules to/from the oxide semiconductor is made easy according to the formation of the opening portion 19, and, after the characteristic is controlled to a characteristic optimal to the post-processing, the composition of the oxide semiconductor is fixed as possibly as can, and thus, it is necessary to close the opening portion 19 by forming the fourth protective film 15.

Embodiment 2

Configuration of Embodiment 2

Figure 7:
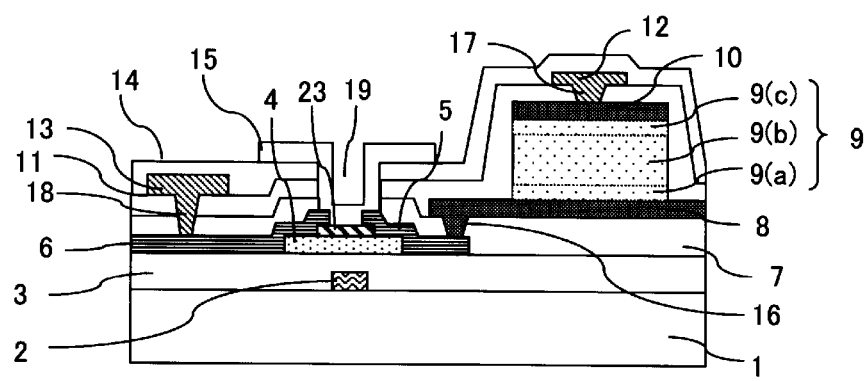
FIG. 7 is a cross-sectional view of the element structure of a semiconductor device according to Embodiment 2 of the present invention.

FIG. 7 is a cross-sectional view of the element structure of a semiconductor device according to Embodiment 2 of the present invention. As a big difference from Embodiment 1, while the channel-digging type structure in which the source electrode 5 and the drain electrode 6 are directly formed right on the oxide semiconductor layer 4 is employed in the case illustrated in FIG. 3, the structure illustrated in FIG. 7 is a channel protecting-type structure in which an etch stop layer 23 is formed in an upper layer of the oxide semiconductor layer 4. A source electrode 5 and the drain electrode 6 are separated from each other and are formed to be partly coated respectively with an oxide semiconductor layer 4 and an etch stop layer 23. The depth of an opening portion 19 is of a degree enabling the etch stop layer 23, the source electrode 5, and the drain electrode 6 to be exposed, and, the etch stop layer 23 or the source electrode 5 and the drain electrode 6 need not to be lost at the time of forming the opening portion 19. The film thickness of the etch stop layer 23 after the formation of the opening portion 19 is preferably small as possibly as can and is 1000 Å or less. In other words, the source electrode 5 and the drain electrode 6 are respectively formed to be in contact with and overlap the etch stop layer 23 and the oxide semiconductor layer 4.

The configurations of a photodiode, protective films 7, 11, 14, and 15, contact holes 16, 17, and 18, gate lines 20, a signal line 13, and a bias line 12 are the same as those according Embodiment 1. In addition, the configurations of a photodiode array substrate and an imaging apparatus are the same as those according to Embodiment 1.

Description of Operation According to Embodiment 2

As illustrated in FIG. 7, on a substrate 1, a gate electrode 2, a gate insulating film 3, and an oxide semiconductor layer 4 are sequentially formed from the below. The gate electrode 2, the gate insulating film 3, and the oxide semiconductor layer 4 are the same as those according to Embodiment 1.

After the formation of the oxide semiconductor layer 4, an etch stop layer 23 is formed right above the channel region of the oxide semiconductor layer 4. Since the size of the etch stop layer 23 determines a channel length, the size is determined in accordance with a channel length desired to be designed. The etch stop layer 23 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4. A material for which the oxide semiconductor layer 4 is difficult to etch at the time of patterning the etch stop layer 23 is selected from among the materials described above. Alternatively, an etchant that cannot easily etch the oxide semiconductor layer 4 at the time of patterning the etch stop layer 23 is used. For example, in a case where the etch stop layer 23 is a silicon oxide film, plasma etching is performed using a fluorine-based gas.

After the formation of the etch stop layer 23, a source electrode 5 and a drain electrode 6 are formed to be separated from each other in the upper layer of the etch stop layer 23 and the oxide semiconductor layer 4. The widths of the source electrode 5 and the drain electrode 6 are patterned to be larger than that of the oxide semiconductor layer 4. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4 and is difficult to etch as the source electrode 5 and the drain electrode 6 at the time of opening the first protective film 7 later is selected from among the materials described above.

Thereafter, a first protective film 7, a first contact hole 16, a lower electrode 8, a hydrogenated amorphous silicon layer 9, an upper electrode 10, a second protective film 11, a second contact hole 17, a third contact hole 18, a bias line 12, a signal line 13, and a third protective film 14 are formed in the mentioned order similar to Embodiment 1.

After the formation of the third protective film 14, an opening portion 19 is formed. The opening portion 19 is positioned right above the channel region of the oxide semiconductor layer 4 and partly removes the first protective film 7 to the third protective film 14 such that the etch stop layer 23 is exposed. The size of the opening portion 19 is configured to include the back channel region of the oxide semiconductor layer 4 and be large. However, the opening portion 19 is configured to have a position, a size, and a depth such that the hydrogenated amorphous silicon layer 9, the upper electrode 10, the gate line 20, the signal line 13, and the bias line 12 are not exposed. When the opening portion 19 is formed, an etchant that can easily etch the first protective film 7 to the third protective film 14 but cannot easily etch the oxide semiconductor layer 4, the source electrode 5, the drain electrode 6, and the etch stop layer 23, and more preferably, the gate insulating film 3 is selected and used. The film thickness of the etch stop layer 23 after the formation of the opening portion 19 is 1000 Å or less.

After the formation of the opening portion 19, post-processing for enhancing the semiconductor characteristic is performed for the altered oxide semiconductor layer 4(a). The post-processing that is assumed represents, in addition to thermal annealing for detaching oxygen and hydrogen, placement under reduced pressure, and pressure-reduced annealing, a process using a gas having a property for introducing oxygen and increasing the membrane resistance of the oxide semiconductor or a mixed gas thereof, a gas lowering the membrane resistance of the oxide semiconductor by detaching oxygen or a mixed gas thereof, an oxidizing gas and a reducing gas having a property being capable of giving/receiving electrons to/from the oxide semiconductor layer 4(a) without exchanging oxygen and changing the electron density of the oxide semiconductor or a mixed gas thereof. Here, water vapor, oxygen, ozone, hydrogen peroxide, dinitrogen oxide, oxygen radical, a simple substance halogen having a vapor phase, and the like correspond to the gas increasing the membrane resistance of the oxide semiconductor by introducing oxygen or lowering the electron density. In addition, carbon monoxide, sulfur dioxide, sulfur hydrogen, and the like correspond to the gas decreasing the membrane resistance of the oxide semiconductor by detaching oxygen or raising the electron density. A process described here may be either standing or a plasma process. However, a process using a substance acting as an etchant of the oxide semiconductor layer 4 or the source electrode 5, the drain electrode 6, and the etch stop layer 23 among the substances corresponding to the description presented above is excluded from the post-processing. The altered oxide semiconductor layer 4(a) is post-processed and then is reformed into the oxide semiconductor layer 4.

Thereafter, a fourth protective film 15 is formed. The fourth protective film 15 is formed similar to Embodiment 1. The configuration of a radiation imaging apparatus that is an application of Embodiment 2 is the same as that according to Embodiment 1.

Description of Effect of Embodiment 2

The effects of the formation of the opening portion 19 are the same as those according to Embodiment 1. As an effect according to Embodiment 2, different from Embodiment 1, in Embodiment 2, when the source electrode 5 and the drain electrode 6 are etched, the etchant is exposed to the oxide semiconductor layer 4 and disappears. Thus, in Embodiment 2, similar to Embodiment 1, in a case where the source electrode 5 and the drain electrode 6 are etched, also in a case where a combination of metal materials or etchants not causing the oxide semiconductor layer 4 to be etched cannot be used, the element structure according to the present invention can be implemented.

Embodiment 3

Configuration of Embodiment 3

Figure 8:
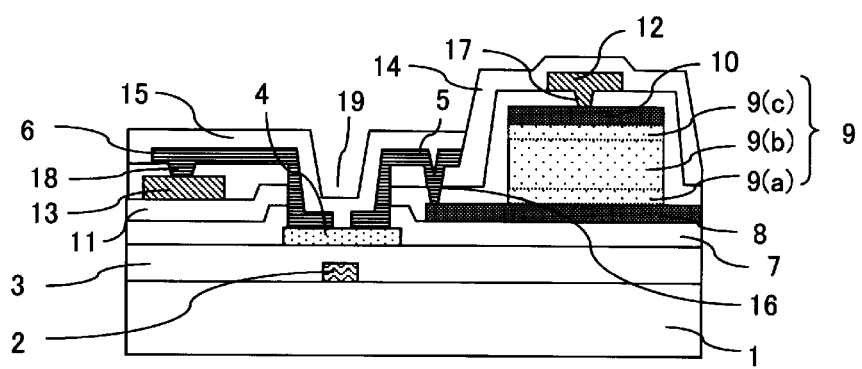
FIG. 8 is a cross-sectional view of the element structure of a semiconductor device according to Embodiment 3 of the present invention.

FIG. 8 is a cross-sectional view of the element structure of a semiconductor device according to Embodiment 3 of the present invention. As a big difference from Embodiment 1, a source electrode 5 and a drain electrode 6 are formed as films after the formation of an opening portion 19. In addition, a first contact hole 16 connecting a lower electrode 8 and the source electrode 5 is formed not in a first protective film 7 but in a second protective film 11 and a third protective film 14. Accordingly, the source electrode 5 is connected to an upper face of the lower electrode 8. In addition, since a third contact hole 18 is formed in the third protective film 14, the drain electrode 6 is connected to an upper face of the signal line 13. The opening portion 19 disposed on the right upper side of oxide semiconductor includes a channel region and is open in a range that is a total sum of a contact area between the channel region and the source electrode 5 and a contact area with the drain electrode 6. The source electrode 5 and the drain electrode 6 are formed to have widths larger than the opening portion 19. Thus, when seen in the direction of the channel width of the TFT, in a case where the opening portion 19 is disposed on a further inner side than the oxide semiconductor layer 4, the channel width is determined depending on the width of the opening portion 19. On the other hand, in a case where the opening portion 19 extends to a further outer side than the oxide semiconductor layer 4, the channel width is determined depending on the width of the oxide semiconductor layer 4. The depth of the opening portion 19 is of a degree for which the oxide semiconductor layer 4 is exposed, and the oxide semiconductor layer 4 needs not to be lost at the time of forming the opening portion 19. Not only the opening portion 19 but also the entirety of the source electrode 5 and the drain electrode 6 is coated with a fourth protective film 15.

The configurations of a photodiode, first to third protective films 7, 11, and 14, a second contact hole 17, a signal line 13, a gate line 20, and a bias line 12 are the same as those according Embodiment 1. In addition, the configurations of a photodiode array substrate and an imaging apparatus are the same as those according to Embodiment 1.

Description of Operation According to Embodiment 3

As illustrated in FIG. 8, on a substrate 1, a gate electrode 2, a gate insulating film 3, and an oxide semiconductor layer 4 are sequentially formed from the below. The gate electrode 2, the gate insulating film 3, and the oxide semiconductor layer 4 are the same as those according to Embodiment 1.

After the formation of the oxide semiconductor layer 4 as a film, the source electrode 5 and the drain electrode 6 are not formed, but a first protective film 7 with which the oxide semiconductor layer 4 is coated is formed. The first protective film 7 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4.

After the formation of the first protective film 7, the first contact hole 16 is not formed, but a lower electrode 8 is formed. A metal material used for the lower electrode 8 is metal including at least one or more of Al, Ni, Mo, Ti, Cr, Ta, W, Zn, Cu, In, Au, La, Nb, and Nd or an alloy thereof, and a material having low contact resistance with the drain electrode 6 is selected. The lower electrode 8 is patterned so as not to cover the oxide semiconductor area.

Thereafter, a hydrogenated amorphous silicon layer 9, an upper electrode 10, and a second protective film 11 are formed similar to Embodiment 1.

After the formation of the second protective film 11, a second contact hole 17 used for connecting the upper electrode 10 and a bias line 12 to be formed later is formed. The second contact hole 17 is formed in a portion right above the upper electrode 10, and the second protective film 11 is removed by forming the second contact hole 17, whereby the upper electrode 10 is partly exposed.

After the formation of the second contact hole 17, a bias line 12 and a signal line 13 are formed. The bias line 12 and the signal line 13 can be simultaneously patterned using a same mask. A metal material used by the bias line 12 and the signal line 13 is metal containing at least one or more of Al, Ni, Mo, Ti, Cr, Ta, W, Zn, Cu, In, Au, La, Nb, and Nd or an alloy thereof. As the material of the bias line 12, a material having low contact resistance with the upper electrode 10 is selected. The bias line 12 is arranged to be formed right above the second contact hole 17, and the signal line 13 is formed to be arranged right below the third contact hole 18 to be formed later.

Next a third protective film 14 is formed similar to Embodiment 1.

After the formation of the third protective film 14, an opening portion 19, a first contact hole 16, and a third contact hole 18 are simultaneously formed. The opening portion 19 is positioned right above the oxide semiconductor layer 4 and partly removes the first protective film 7 to the third protective film 14 such that the back channel region of the TFT is exposed. The size of the opening portion 19 is configured to include the back channel region of the oxide semiconductor layer 4 and connection areas of the source electrode 5 and the drain electrode 6 and be large. However, the opening portion 19 is configured to have a position, a size, and a depth such that the lower electrode 8, the hydrogenated amorphous silicon layer 9, the upper electrode 10, the gate line 20, the signal line 13, and the bias line 12 are not exposed. When the opening portion 19 is formed, an etchant that can easily etch the first protective film 7 to the third protective film 14 but cannot easily etch the oxide semiconductor layer 4, and more preferably, the gate insulating film 3 is selected and used. The first contact hole 16 is positioned right above the lower electrode 8 and removes the second protective film 11 and the third protective film 14 such that the lower electrode 8 is partly exposed. The third contact hole 18 is positioned right above the signal line 13 and removes the third protective film 14 such that the signal line 13 is partly exposed.

A method of executing the post-processing after the formation of the opening portion 19 is performed similar to Embodiment 1.

After the formation of the opening portion 19, and post-processing for enhancing the semiconductor characteristic is performed, a source electrode 5 and a drain electrode 6 are formed to be separated from each other by a channel length. The widths of the source electrode 5 and the drain electrode 6 are patterned to be larger than the width of the opening portion 19 and are connected to the oxide semiconductor layer 4 through the opening portion 19. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4, for which it is difficult for the oxide semiconductor to be etched at the time of patterning the source electrode 5 and the drain electrode 6, is selected from among the materials described above. Alternatively, an etchant for which it is difficult for the oxide semiconductor to be etched is used.

After the source electrode 5 and the drain electrode 6 are formed, a fourth protective film 15 that protects the oxide semiconductor layer 4, the source electrode 5, and the drain electrode 6 is formed. The fourth protective film 15 is configured as a single layer or a stacked film including any one of a SiOx film, a SiON film, an $Al_2O_3$ film, a $TiO_2$ film, a $Y_2O_3$ film, an ATO film, a high-impurity SiNx film having low hydrogen concentration, and an insulating film having low hydrogen concentration of the other film and suppressing diffusion and penetration of water or hydrogen into the oxide semiconductor layer 4, and a film quality or a film thickness for low stress are selected and set. In addition, for a thin film having the same material, the membrane stress can be adjusted by using a film formation condition.

The configuration of a radiation imaging apparatus that is an application of Embodiment 3 is the same as that according to Embodiment 1.

Description of Effect of Embodiment 3

The effects of the formation of the opening portion 19 are the same as those according to Embodiment 1. As an effect according to Embodiment 3, first, while post-processing cannot be performed for the connection area of the oxide semiconductor layer 4 between the source electrode 5 and the drain electrode 6 in Embodiment 1 and Embodiment 2, such a connection area can be processed in Embodiment 3.

In Embodiments 1 and 2, while the source electrode 5, the drain electrode 6, and the etch stop layer 23 are present at the time of performing the post-processing, and thus, in a case where processing using gas molecules, particularly, having a large molecular size is performed, there is a possibility that the post-processing of the characteristic recovery of the oxide semiconductor does not effectively act.

Second, in Embodiments 1 and 2, while post-processing having an adverse effect such as post-processing corroding or eliminating the source electrode 5 and the drain electrode 6 other than the oxide semiconductor layer 4 cannot be used, in Embodiment 3, only the oxide semiconductor layer 4 is formed at the time of performing the post-processing. Accordingly, the range of usable gas processing is widened. In addition, since the source electrode 5 and the drain electrode 6 are not influenced by the post-processing, there is no concern about corrosion and the like.

Embodiment 4

Configuration of Embodiment 4

Figure 9:
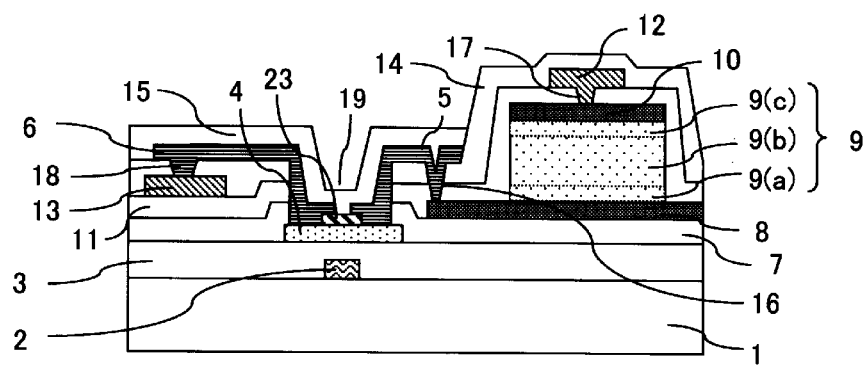
FIG. 9 is a cross-sectional view of the element structure of a semiconductor device according to Embodiment 4 of the present invention.

FIG. 9 is a cross-sectional view of the element structure of a semiconductor device according to Embodiment 4 of the present invention. A difference from Embodiment 3 is that an etch stop layer 23 is added. A source electrode 5 and a drain electrode 6 are separated from each other, and an oxide semiconductor layer 4 and an etch stop layer 23 are partly coated respectively therewith.

Configurations other than the etch stop layer 23 are the same as those according to Embodiment 3. In addition, the configurations of a photodiode array substrate and an imaging apparatus are the same as those according to Embodiment 1.

Description of Operation According to Embodiment 4

As illustrated in FIG. 9, similar to Embodiment 3, on a substrate 1, a gate electrode 2, a gate insulating film 3, an oxide semiconductor layer 4, a first protective film 7, a lower electrode 8, a hydrogenated amorphous silicon layer 9, an upper electrode 10, a second protective film 11, a second contact hole 17, a bias line 12, a signal line 13, a third protective film 14, an opening portion 19, a first contact hole 16, and a third contact hole 18 are sequentially formed from the below. After the formation of the opening portion 19, post-processing enhancing the semiconductor characteristic is performed, and an etch stop layer 23 is formed right above the channel region of the oxide semiconductor layer 4. Since the size of the etch stop layer 23 determines a channel length, the size is determined in accordance with a channel length desired to be designed. The etch stop layer 23 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4. A material for which the oxide semiconductor is difficult to etch at the time of patterning the etch stop layer 23 is selected from among the materials described above. Alternatively, an etchant that cannot easily etch the oxide semiconductor is used.

After the formation of the etch stop layer 23, a source electrode 5 and a drain electrode 6 are formed to be separated from each other in the upper layer of the etch stop layer 23 and the oxide semiconductor layer 4. The source electrode 5 and the drain electrode 6 are patterned to have widths larger than that of the opening portion 19 and are connected to the oxide semiconductor layer 4 through the opening portion 19. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4 is selected from among the materials described above.

Thereafter, similar to Embodiment 3, a fourth protective film 15 is formed. The configuration of a radiation imaging apparatus that is an application of Embodiment 4 is the same as that according to Embodiment 1.

Description of Effect of Embodiment 4

The effects according to Embodiment 4 are the same as those according to Embodiment 3. The effects according to the etch stop layer 23 are the same as those according to Embodiment 2.

Embodiment 5

Configuration of Embodiment 5

Figure 10:
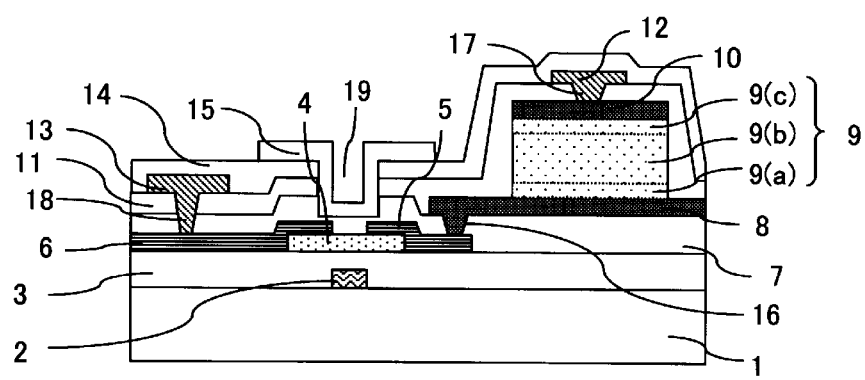
FIG. 10 is a cross-sectional view of the element structure of a semiconductor device according to Embodiment 5 of the present invention.

FIG. 10 is a cross-sectional view of the element structure of a semiconductor device according to Embodiment 5 of the present invention. A big difference from Embodiment 1 is that, when an opening portion 19 is formed, the back channel region of an oxide semiconductor layer 4 is not exposed but is caused to remain at a degree for thinning a first protective film 7. As the film thickness of the thinned area of the first protective film 7, an appropriate film thickness differs depending on the molecular size of gas molecules used for post-processing and is 1000 Å or less.

All the configurations other than the shape of the opening portion 19 are the same as those according to Embodiment 1. In addition, the configurations of a photodiode array substrates and an imaging apparatus are the same as those according to Embodiment 1.

Description of Operation According to Embodiment 5

As illustrated in FIG. 10, similar to Embodiment 1, on the upper face of a substrate 1, a gate electrode 2, a gate insulating film 3, an oxide semiconductor layer 4, a source electrode 5, a drain electrode 6, a first protective film 7, a first contact hole 16, a lower electrode 8, a hydrogenated amorphous silicon layer 9, an upper electrode 10, a second protective film 11, a second contact hole 17, a third contact hole 18, a bias line 12, a signal line 13, and a third protective film 14 are sequentially formed from the below.

After the formation of the third protective film 14, an opening portion 19 is formed. The opening portion 19 is positioned right above the oxide semiconductor layer 4 and removes the first protective film 7 to the third protective film 14 such that the back channel region of the TFT is not exposed. The size of the opening portion 19 is configured to include the back channel region of the oxide semiconductor layer 4 and be large. However, the opening portion 19 is configured to have a position, a size, and a depth such that the lower electrode 8, the hydrogenated amorphous silicon layer 9, the upper electrode 10, the gate line 20, the signal line 13, and the bias line 12 are not exposed. When the opening portion 19 is formed, it is preferable to select and use a protective film material or an etchant that can easily etch the second protective film 11 and the third protective film 14 and has a slightly low etching rate for the first protective film 7 but cannot easily etch the oxide semiconductor layer 4, the source electrode 5, the drain electrode 6, and the gate insulating film 3. The film remainder of the opening portion 19 is 1000 Å or less and is formed at least to be thinner than the first protective film 7 immediately after the film formation.

Similar to Embodiment 1, post-processing after the formation of the opening portion 19 is performed, whereby a fourth protective film 15 is formed. The configuration of a radiation imaging apparatus that is an application of Embodiment 5 is the same as that according to Embodiment 1.

Description of Effect of Embodiment 5

The effects of the formation of the opening portion 19 are the same as those according to Embodiment 1. As effects according to Embodiment 5, unlike Embodiment 1, the entire oxide semiconductor layer 4 is not exposed, and thus, the etching time can be shortened compared to Embodiment 1, and damage according to the etching of the surface of the oxide semiconductor layer 4 and an adverse effect caused thereby can be reduced. In addition, regarding the depth of the opening portion according to the present invention, even in a case where the first protective film 7 of some elements is removed, or remaining film thicknesses of some elements are larger than those of the other elements to some degree due to the influence of more or less unbalance inside the face, a time for gas molecules used for the post-processing to penetrate into the oxide semiconductor is slightly changed, and a serious problem is not caused.

Embodiment 6

Configuration of Embodiment 6

Figure 11:
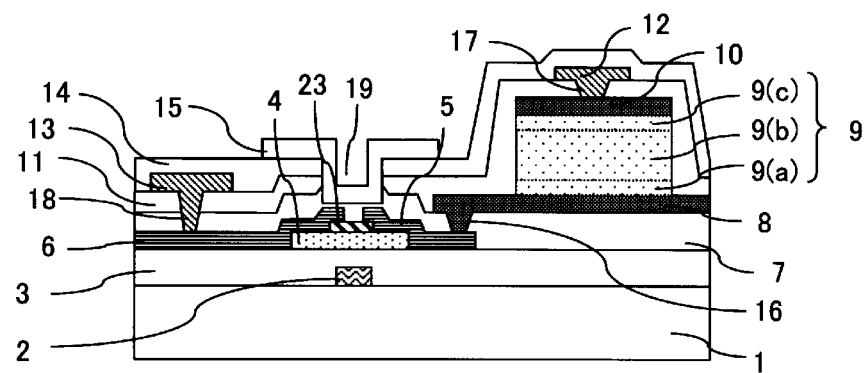
FIG. 11 is a cross-sectional view of the element structure of a semiconductor device according to Embodiment 6 of the present invention.

FIG. 11 is a cross-sectional view of the element structure of a semiconductor device according to Embodiment 6 of the present invention. A difference from Embodiment 5 is that an etch stop layer 23 is added. A source electrode 5 and a drain electrode 6 are separated from each other and are formed to be partly coated respectively with an oxide semiconductor layer 4 and an etch stop layer 23.

Configurations other than the etch stop layer 23 are the same as those according to Embodiment 5. In addition, the configurations of a photodiode array substrate and an imaging apparatus are the same as those according to Embodiment 1.

Description of Operation According to Embodiment 6

As illustrated in FIG. 11, similar to Embodiment 1 and Embodiment 5, on the upper face of a substrate 1, a gate electrode 2, a gate insulating film 3, and an oxide semiconductor layer 4 are sequentially formed from the below.

After the formation of oxide semiconductor layer 4, an etch stop layer 23 is formed right above the channel region of the oxide semiconductor layer 4. Since the size of the etch stop layer 23 determines a channel length, the size is determined in accordance with a channel length desired to be designed. The etch stop layer 23 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4. A material for which the oxide semiconductor is difficult to etch at the time of patterning the etch stop layer 23 is selected from among the materials described above. Alternatively, an etchant that cannot easily etch the oxide semiconductor at the time of patterning the etch stop layer 23 is used.

After the formation of the etch stop layer 23, a source electrode 5 and a drain electrode 6 are formed to be separated from each other in the upper layer of the etch stop layer 23 and the oxide semiconductor layer 4. The source electrode 5 and the drain electrode 6 are patterned to have widths larger than that of the oxide semiconductor layer 4. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4 is selected from among the materials described above.

Thereafter, from the below, a first protective film 7, a first contact hole 16, a lower electrode 8, a hydrogenated amorphous silicon layer 9, an upper electrode 10, a second protective film 11, a second contact hole 17, a third contact hole 18, a bias line 12, a signal line 13, and a third protective film 14 are formed in the mentioned order similar to Embodiment 5.

After the formation of the third protective film 14, an opening portion 19 is formed. The opening portion 19 is positioned right above the oxide semiconductor layer 4 and the etch stop layer 23 and removes the first protective film 7 to the third protective film 14 such that the etch stop layer 23 of the TFT is not exposed. The size of the opening portion 19 is configured to include the back channel region of the oxide semiconductor layer 4 and be large. However, the opening portion 19 is configured to have a position, a size, and a depth such that the lower electrode 8, the hydrogenated amorphous silicon layer 9, the upper electrode 10, the gate line 20, the signal line 13, and the bias line 12 are not exposed. When the opening portion 19 is formed, it is preferable to select and use an etchant that can easily etch the second protective film 11 and the third protective film 14 and has a slightly low etching rate for the first protective film 7 but cannot easily etch the etch stop layer 23, the oxide semiconductor layer 4, the source electrode 5, the drain electrode 6, and the gate insulating film 3. The remaining film thickness of the protective film of the opening portion 19 is 1000 Å or less together with the etch stop layer 23 and is formed at least to be thinner than the first protective film 7 immediately after the film formation.

Similar to Embodiments 1 and 5, post-processing after the formation of the opening portion 19 is performed, whereby a fourth protective film 15 is formed. The configuration of a radiation imaging apparatus that is an application of Embodiment 6 is the same as that according to Embodiment 1.

Description of Effect of Embodiment 6

The effects of the formation of the opening portion 19 are the same as those according to Embodiment 1. The effect of causing a part of the first protective film 7 to remain without removing the entirety of the first protective film 7 at the time of forming the opening portion 19 is the same as that according to Embodiment 5. The effect according to Embodiment 6 is that the oxide semiconductor layer 4 is exposed to an etchant used for etching the source electrode 5 and the drain electrode 6 and disappears.

Embodiment 7

Configuration of Embodiment 7

Figure 12:
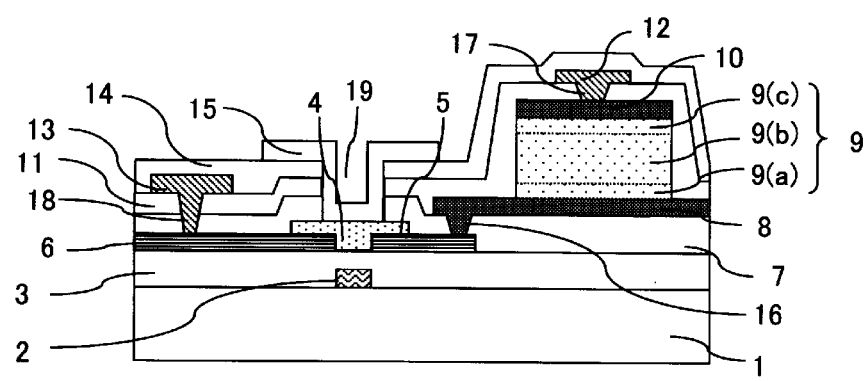
FIG. 12 is a cross-sectional view of the element structure of a semiconductor device according to Embodiment 7 of the present invention.

FIG. 12 is a cross-sectional view of the element structure of a semiconductor device according to Embodiment 7 of the present invention. As a big difference from Embodiment 1, a bottom contact-type TFT is formed in which a source electrode 5 and a drain electrode 6 are connected to the lower face of an oxide semiconductor layer 4.

The configurations of a photodiode, a signal line 13, a gate line 20, and a bias line 12 are the same as those according Embodiment 1. In addition, the configurations of a photodiode array substrate and an imaging apparatus are the same as those according to Embodiment 1.

Description of Operation According to Embodiment 7

As illustrated in FIG. 12, similar to Embodiment 1, a gate electrode 2 and a gate insulating film 3 are sequentially formed on the upper face of a substrate 1 from the below.

On the upper layer of the gate insulating film 3, a source electrode 5 and a drain electrode 6 are formed to be separated from each other by a channel length. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with an oxide semiconductor layer 4 to be formed later is selected from among the materials described above. In addition, a metal material that is difficult to etch at the time of patterning the oxide semiconductor layer 4 to be formed later in a case where the source electrode 5 and the drain electrode 6 are formed using the metal material is selected from among the materials described above. For example, since the etching rate of wet etching of Ni is lower than that of oxide semiconductor in a mixed liquid of hydrochloric acid and nitric acid, Ni is appropriate as the metal material of the source electrode 5 and the drain electrode 6.

After the formation of the source electrode 5 and the drain electrode 6, an oxide semiconductor layer 4 is formed in an island shape between the source electrode 5 and the drain electrode 6. An etchant that cannot easily etch the source electrode 5 and the drain electrode 6 at the time of patterning the oxide semiconductor is used. After the oxide semiconductor layer 4 is patterned, annealing of 250° C. or higher is performed.

Thereafter, similar to Embodiment 1, sequentially from the below, a first protective film 7, a first contact hole 16, a lower electrode 8, a hydrogenated amorphous silicon layer 9, an upper electrode 10, a second protective film 11, a second contact hole 17, a third contact hole 18, a bias line 12, a signal line 13, and a third protective film 14 are formed.

After the formation of the third protective film 14, an opening portion 19 is formed. The opening portion 19 is positioned right above the oxide semiconductor layer 4 and partly removes the first protective film 7 to the third protective film 14 such that the back channel region of the TFT is exposed. The size of the opening portion 19 is configured to include the back channel region of the oxide semiconductor layer 4 and be large. However, the opening portion 19 is configured to have a position, a size, and a depth such that the lower electrode 8, the hydrogenated amorphous silicon layer 9, the upper electrode 10, the gate line 20, the signal line 13, and the bias line 12 are not exposed. When the opening portion 19 is formed, it is preferable that an etchant that can easily etch the first protective film 7 to the third protective film 14 but cannot easily etch the oxide semiconductor layer 4 and the gate insulating film 3 is selected and used.

After the formation of the opening portion 19, post-processing for enhancing the semiconductor characteristic is performed for the altered oxide semiconductor layer 4(a). The post-processing that is assumed represents, in addition to thermal annealing for detaching oxygen and hydrogen, placement under reduced pressure, and pressure-reduced annealing, a process using a gas having a property for introducing oxygen and increasing the membrane resistance of the oxide semiconductor or a mixed gas thereof, a gas lowering the membrane resistance of the oxide semiconductor by detaching oxygen or a mixed gas thereof, an oxidizing gas and a reducing gas having a property being capable of giving/receiving electrons to/from the oxide semiconductor layer 4(a) without exchanging oxygen and changing the electron density of the oxide semiconductor or a mixed gas thereof. Here, water vapor, oxygen, ozone, hydrogen peroxide, dinitrogen oxide, oxygen radical, a simple substance halogen having a vapor phase, and the like correspond to the gas increasing the membrane resistance of the oxide semiconductor by introducing oxygen or lowering the electron density. In addition, carbon monoxide, sulfur dioxide, sulfur hydrogen, and the like correspond to the gas decreasing the membrane resistance of the oxide semiconductor by detaching oxygen or raising the electron density. A process described here may be either standing or a plasma process. However, a process using a substance acting as an etchant of the oxide semiconductor layer 4 among the substances corresponding to the description presented above is excluded from the post-processing. The altered oxide semiconductor layer 4(a) is post-processed and then is reformed into the oxide semiconductor layer 4.

The formation of a fourth protective film 15 is similar to Embodiment 1. The configuration of a radiation imaging apparatus that is an application of Embodiment 7 is similar to that according to Embodiment 1.

Description of Effect of Embodiment 7

The effects of the opening are the same as those according to Embodiment 1. A big difference from Embodiments 1, 3, and 4 is that the structure of the TFT is the bottom contact type in Embodiment 7. Accordingly, there is no damage in connection areas between the source electrode 5 and the drain electrode 6 and the oxide semiconductor layer 4 in accordance with an etching process executed at the time of forming the opening portion 19. For this reason, compared to Embodiments 3 and 4, the adhesiveness between the oxide semiconductor layer 4 and the source electrode 5 and the drain electrode 6 is high, and the connection resistance is stabilized to be low. In addition, since the source electrode 5 and the drain electrode 6 are not present in the upper layer of the oxide semiconductor layer 4, an exposed area of the oxide semiconductor layer 4 is broader than that of Embodiment 1, and, as a result, further effects of the post-processing can be easily acquired.

Embodiment 8

Configuration of Embodiment 8

Figure 13:
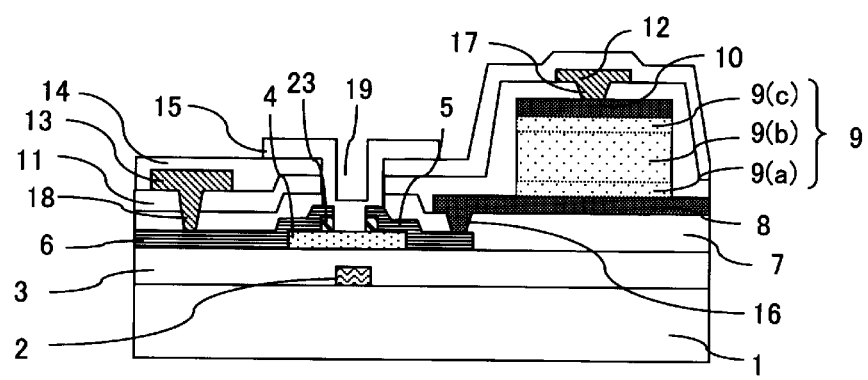
FIG. 13 is a cross-sectional view of the element structure of a semiconductor device according to Embodiment 8 of the present invention.

FIG. 13 is a cross-sectional view of the element structure of a semiconductor device according to Embodiment 8 of the present invention. A big difference from Embodiment 2 employing the same channel protection type is that an etch stop layer 23 is removed at the time of forming an opening portion 19, and the back channel region is exposed. In order to remove the back channel region at the time of forming the opening portion 19, finally, only portions of the etch stop layer 23 overlapping the source electrode 5 and the drain electrode 6 in a plane are present.

All the configurations other than the shape of the etch stop layer are the same as those according to Embodiment 2. In addition, the configurations of a photodiode array substrate and an imaging apparatus are the same as those according to Embodiment 1.

Description of Operation According to Embodiment 8

As illustrated in FIG. 13, similar to Embodiment 1, a gate electrode 2, a gate insulating film 3, and an oxide semiconductor layer 4 are formed on the upper face of a substrate 1 in the mentioned order from the below.

After the formation of the oxide semiconductor layer 4, an etch stop layer 23 is formed right above the channel region of the oxide semiconductor layer 4. Since the size of the etch stop layer 23 determines a channel length, the size is determined in accordance with a channel length desired to be designed. The etch stop layer 23 is configured as a single layer or a stacked film including any one of an insulating film containing silicon, an $Al_2O_3$ film, a $TiO_2$ film, a $Y_2O_3$ film, an ATO film, an organic film of acryl or the like, and an insulating film suppressing diffusion and penetration of other water or hydrogen into the oxide semiconductor layer 4. A material for which the oxide semiconductor is difficult to etch at the time of patterning the etch stop layer 23 is selected from among the materials described above. Alternatively, an etchant that cannot easily etch the oxide semiconductor layer 4 is used.

After the formation of the etch stop layer 23, a source electrode 5 and a drain electrode 6 are formed to be separated from each other in the upper layer of the etch stop layer 23 and the oxide semiconductor layer 4. The widths of the source electrode 5 and the drain electrode 6 are patterned to be larger than that of the oxide semiconductor layer 4. A material used for the source electrode 5 and the drain electrode 6 is metal including at least one or more of Al, Ni, Mo, Ti, Cr, Ta, W, Zn, Cu, In, Au, La, Nb, and Nd or an alloy thereof, and a metal material that has superior ohmic connectivity with the oxide semiconductor layer 4 and is difficult to etch as the source electrode 5 and the drain electrode 6 at the time of opening the first protective film 7 later is selected from among the materials described above.

Thereafter, similar to Embodiment 1, a first protective film 7, a first contact hole 16, a lower electrode 8, a hydrogenated amorphous silicon layer 9, an upper electrode 10, a second protective film 11, a second contact hole 17, a third contact hole 18, a bias line 12, a signal line 13, and a third protective film 14 are formed in the mentioned order.

After the formation of the third protective film 14, an opening portion 19 is formed. The opening portion 19 is positioned right above the channel region of the oxide semiconductor layer 4 and partly removes the first protective film 7 to the third protective film 14 and up to the etch stop layer 23 such that the oxide semiconductor layer 4 is exposed. The size of the opening portion 19 is configured to include the back channel region of the oxide semiconductor layer 4 and be large. However, the opening portion 19 is configured to have a position, a size, and a depth such that the hydrogenated amorphous silicon layer 9, the upper electrode 10, the gate line 20, the signal line 13, and the bias line 12 are not exposed. When the opening portion 19 is formed, an etchant that can easily etch the first protective film 7 to the third protective film 14 and the etch stop layer 23 but cannot easily etch the oxide semiconductor layer 4, the source electrode 5, and the drain electrode 6, and more preferably, the gate insulating film 3 is selected and used.

Description of Effect of Embodiment 8

The etch stop layer 23 formed as the channel protection type as in Embodiment 2 is arranged so as to protect the oxide semiconductor layer 4 from the etchant used at the time of forming the source electrode 5 and the drain electrode 6. Accordingly, after the formation of the source electrode 5 and the drain electrode 6, the etch stop layer 23 is not necessary, and the back channel region may be removed without causing any problem.

As an effect according to Embodiment 8, similar to Embodiment 2, the back channel surface of the oxide semiconductor can be exposed while the channel protection TFT is employed, and accordingly, the effect of the post-processing of the same degree as that of Embodiment 1 is acquired. According to Embodiment 2, since the etch stop layer 23 remains, compared to Embodiment 1, there is a problem in that it is difficult to acquire the effect of the diffusion and the penetration of gas molecules according to the post-processing. However, by applying Embodiment 8, such a problem can be overcome.

Embodiment 9

Configuration of Embodiment 9

Figure 1:
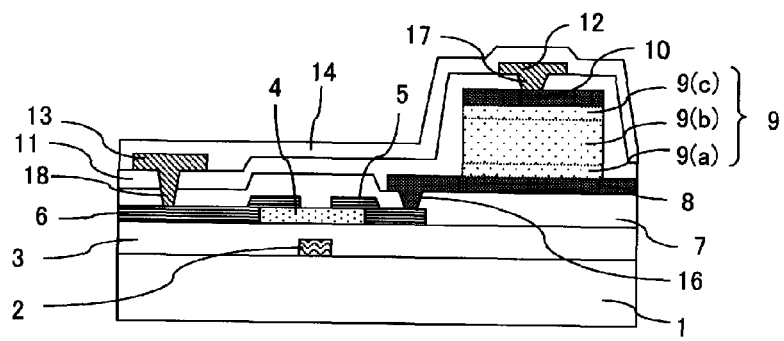
FIG. 1 is a cross-sectional view of the element structure of a conventional semiconductor device.
Figure 2:
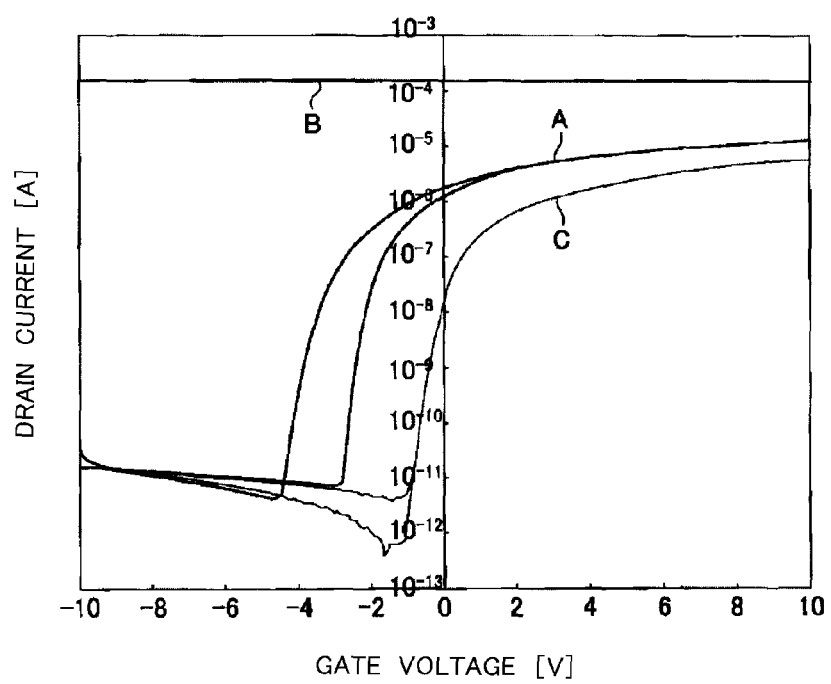
FIG. 2 is a graph that illustrates the transfer characteristic of a TFT using oxide semiconductor according to a conventional technology 1.
Figure 14:
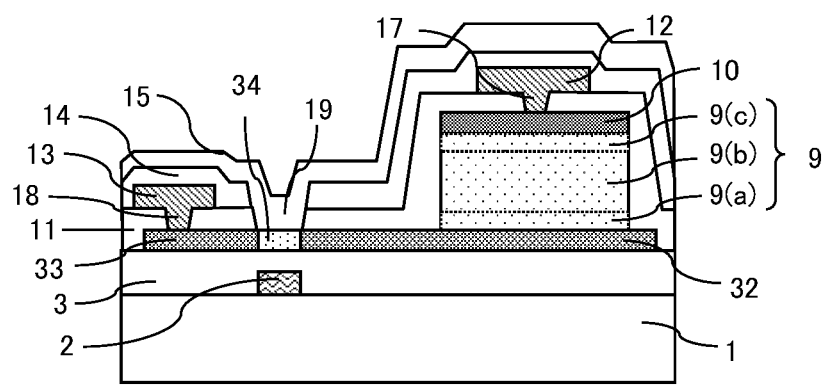
FIG. 14 is a cross-sectional view of the element structure of a semiconductor device according to Embodiment 9 of the present invention.
Figure 15A:
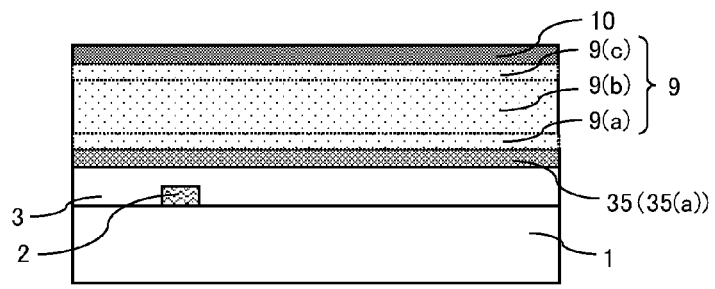
FIGS. 15A to 15D are diagrams that illustrate the process flow according to Embodiment 9 of the present invention.
Figure 15B:
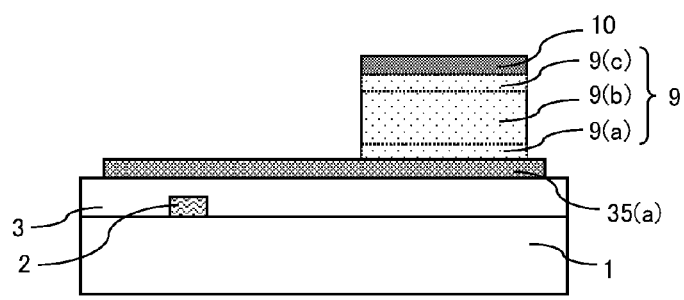
Figure 15C:
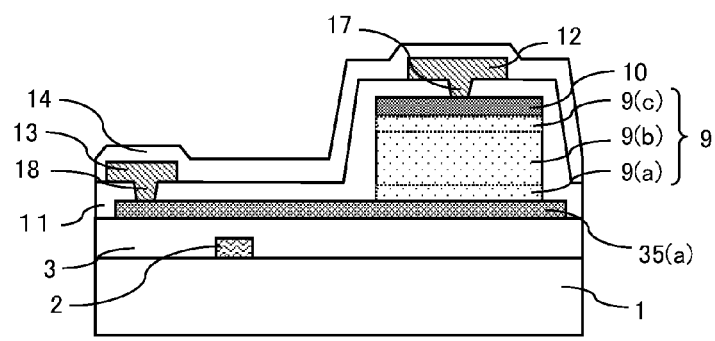
Figure 15D:
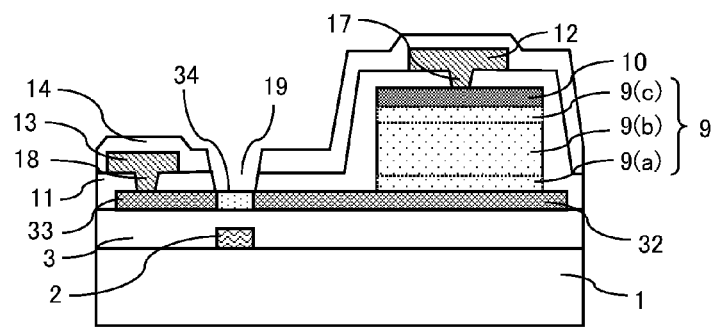

FIG. 14 is a cross-sectional view of the element structure of a semiconductor device according to Embodiment 9 of the present invention. As big differences from Embodiment 1, the source electrode 5, the drain electrode 6, and the lower electrode 8 are not present, a source region 32, a drain region 33, and an active region (a channel region or a back channel region) 34 are formed using an oxide semiconductor thin film 1 layer. In the source region 32, the drain region 33, and the active region 34, an oxide semiconductor thin film is continuously formed, and the regions are not spatially divided. In addition, a boundary between the source region 32 and the active region 34 and a boundary between the drain region 33 and the active region 34 are respectively defined by the positions of side walls of an opening portion 19. The opening portion 19, a second protective film 11, and a third protective film 14 are completed removed, and the active region 34 is exposed. The vertical width and the horizontal width of the active region 34 are smaller than the vertical width and the horizontal width of a gate electrode 2, and the source region 32 and the drain region 33 partly overlap each other through the gate electrode 2 and a gate insulating film 3. The source region 32 and an n+ hydrogenated amorphous silicon layer 9(a) are directly in contact with each other, and the drain region 33 and a signal line 13 are directly in contact with each other through a third contact hole 18. In addition, the source region 32 and the drain region 33, like "B" illustrated in FIG. 2, exhibit a characteristic of not being off (here, an On/Off ratio is less than $10^3$) when the gate voltage is negative. In addition, the active region 34, like "A" or "C" illustrated in FIG. 2, represents a good transistor characteristic (On/Off ratio≥$10^3$). In other words, the resistivity of the source region 32 and the drain region 33 is lower than that of the active region 34.

The configurations of a gate electrode 2, a gate insulating film 3, a hydrogenated amorphous silicon layer 9, an upper electrode 10, a gate line 20, a signal line 13, a bias line 12, a third protective film 14, and a fourth protective film 15 are the same as those according to Embodiment 1. In addition, the configurations of a photodiode array substrate and an imaging apparatus are the same as those according to Embodiment 1.

Description of Operation According to Embodiment 9

FIGS. 15A to 15D illustrate the cross-sectional views during the process of manufacturing a semiconductor device according to Embodiment 9.

As illustrated in FIG. 14, similar to Embodiment 1, a gate electrode 2 and a gate insulating film 3 are formed on the upper face of a substrate 1 in the mentioned order.

In an upper layer of the gate insulating film 3, an oxide semiconductor thin film 35 is formed. The oxide semiconductor thin film 35 is used as a source region 32, a drain region 33, and an active region 34 later. Here, oxide semiconductor represents a compound formed by at least one or more of In, Ga, Zn, and Sn and oxygen.

After the formation of the oxide semiconductor thin film 35, a hydrogenated amorphous silicon layer 9 is formed. The hydrogenated amorphous silicon layer 9 has a structure in which an n+ hydrogenated amorphous silicon layer 9(a), an intrinsic hydrogenated amorphous silicon layer 9(b), and a p+ hydrogenated amorphous silicon layer 9(c) are stacked in the mentioned order from the below. The composition and the film thickness of the hydrogenated amorphous silicon layer 9 are similar to those according to embodiment 1. However, hydrogen plasma is generated in a CVD process forming the hydrogenated amorphous silicon layer 9, and, after the formation of the hydrogenated amorphous silicon layer 9, the oxide semiconductor thin film is altered to a characteristic of not being off (here, the On/Off ratio is assumed to be less than $10^3$) when the gate voltage is negative, like "B" illustrated in FIG. 2. After the formation of the hydrogenated amorphous silicon layer 9 as a film, the oxide semiconductor thin film 35 is changed to an altered oxide semiconductor thin film 35(a).

After the formation of the hydrogenated amorphous silicon layer 9 as a film, an upper electrode material is formed as a film. The upper electrode is a transparent conductive film of ITO or the like that is formed by at least one or more of In, Ga, Zn, and Sn and oxygen. In a case where the film thickness is large, the transmission amount of light decreases, which leads to a decrease in the quantum efficiency, and thus, the upper electrode is formed as a film to have a thickness of 200 nm or less.

After the formation of the upper electrode material as a film, the upper electrode 10 and the hydrogenated amorphous silicon layer 9 are respectively etched in the mentioned order. The upper electrode 10 and the hydrogenated amorphous silicon layer 9 can be patterned using a same mask, and the same pattern or an island pattern in which the upper electrode 10 is slightly smaller than that hydrogenated amorphous silicon layer 9 is formed.

After etching the hydrogenated amorphous silicon layer 9, continuously, the previous oxide semiconductor thin film 35(a) is etched, whereby the outer shapes of the source region 32, the drain region 33, and the active region 34 are formed. At this time, the hydrogenated amorphous silicon layer 9 and the upper electrode 10 are coated with a photoresist and thus, are not exposed to the etchant.

Thereafter, a second protective film 11, a second contact hole 17, a third contact hole 18, a bias line 12, a signal line 13, and a third protective film 14 are formed in the mentioned order similar to Embodiment 1.

After the formation of the third protective film 14, an opening portion 19 is formed. The opening portion 19 is positioned right above the active region 34, and the second protective film 11 and the third protective film 14 are partly removed such that the active region 34 is exposed. However, the opening portion 19 is configured to have a position, a size, and a depth such that the hydrogenated amorphous silicon layer 9, the upper electrode 10, the gate line 20, the signal line 13, and the bias line 12 are not exposed. When the opening portion 19 is formed, an etchant that can easily etch the second protective film 11 and the third protective film 14 but cannot easily etch the active region 34, the source region 32, and the drain region 33, and more preferably, the gate insulating film 3 is selected and used. The opening portion 19 is formed to intersect the oxide semiconductor thin film 35(a) and divides the oxide semiconductor thin film 35(a) into three regions (the source region 32, the drain region 33, and the active region 34). The characteristic of the thin film transistor is determined based on a distance at which the source region 32 and the drain region 33 are adjacent to each other through the active region 34. Accordingly, the width of the opening portion 19 defining the distance at which the source region 32 and the drain region 33 are adjacent to each other is limited to a distance (4 μm to 100 μm) from which a good transistor characteristic is acquired.

After the formation of the opening portion 19, post-processing for enhancing the semiconductor characteristic is performed for the exposed oxide semiconductor thin film 35(a). The post-processing that is assumed represents, in addition to thermal annealing for detaching oxygen and hydrogen, placement under reduced pressure, and pressure-reduced annealing, a process using a gas having a property for introducing oxygen and increasing the membrane resistance of the oxide semiconductor or a mixed gas thereof, a gas lowering the membrane resistance of the oxide semiconductor by detaching oxygen or a mixed gas thereof, an oxidizing gas and a reducing gas having a property being capable of giving/receiving electrons to/from the oxide semiconductor thin film 35 without exchanging oxygen and changing the electron density of the oxide semiconductor or a mixed gas thereof. Here, water vapor, oxygen, ozone, hydrogen peroxide, dinitrogen oxide, oxygen radical, a simple substance halogen having a vapor phase, and the like correspond to the gas increasing the membrane resistance of the oxide semiconductor by introducing oxygen or lowering the electron density. In addition, carbon monoxide, sulfur dioxide, sulfur hydrogen, and the like correspond to the gas decreasing the membrane resistance of the oxide semiconductor by detaching oxygen or raising the electron density. A process described here may be either standing or a plasma process. However, a process using a substance acting as an etchant of the oxide semiconductor thin film 35 among the substances corresponding to the description presented above is excluded from the post-processing. The oxide semiconductor thin film 35(a) of the exposed portion is post-processed and then is reformed into the oxide semiconductor thin film 35, and this acts as the active region 34.

Thereafter, a fourth protective film 15 is formed. The fourth protective film 15 is formed similar to Embodiment 1.

The configuration of a radiation imaging apparatus that is an application of Embodiment 9 is the same as that according to Embodiment 1.

Description of Effect of Embodiment 9

As an effect according to Embodiment 9, different from Embodiment 1, the source electrode 5, the drain electrode 6, the lower electrode 8 are not arranged but are substituted for the oxide semiconductor thin film 35 of one layer, and accordingly, there is an effect of improving the productivity by decreasing the number of masks. Actually, in case of Embodiment 1, while nine masks are necessary until the opening portion 19 is formed from the gate electrode 2, in case of Embodiment 9, only six masks are necessary for the production. In addition, in a case where In—Ga—Zn—O is assumed as an example of the oxide semiconductor, it is known that In—Ga—Zn—O is easily degenerated by hydrogen plasma, and the Fermi level is raised near the conduction band (about 4.3 eV; see JP 2011-119692 A). This represents that a contact resistance with the n+ hydrogenated amorphous silicon layer 9(a) is of a same level as the levels of Al, Ni, Mo, Ti, Cr, Ta, W, Zn, Cu, In, Au, La, Nb, Nd, and the like (work function: 4.1 eV to 5.2 eV) considered as metal used for the lower electrode 8. Accordingly, also in a case where the lower electrode 8 is substituted for the degenerated In—Ga—Zn—O, a photodiode characteristic that is equivalent to that according to Embodiment 1 is exhibited.

Embodiment 10

Configuration of Embodiment 10

Figure 16:
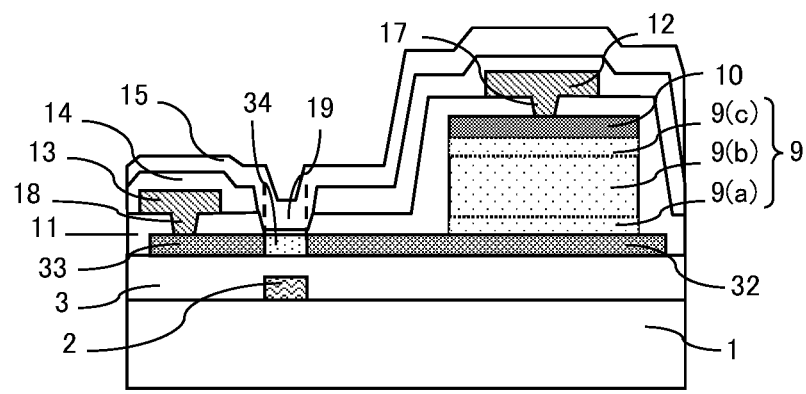
FIG. 16 is a cross-sectional view of the element structure of a semiconductor device according to Embodiment 10 of the present invention.

FIG. 16 is a cross-sectional view of the element structure of a semiconductor device according to Embodiment 10 of the present invention. As big differences from Embodiment 9, the bottom of an opening portion 19 is in the middle of a second protective film 11, and an active region 34 is not exposed. The position of the active region 34 in Embodiment 10 is defined as positions intersecting an oxide semiconductor thin film 35 when external insertion is vertically performed from positions of side walls at the bottom of the opening portion 19 to a substrate 1.

The configurations other than the opening portion 19 are the same as those according to Embodiment 9. In addition, the configurations of a photodiode array substrate and an imaging apparatus are the same as those according to Embodiment 1.

Description of Operation According to Embodiment 10

As illustrated in FIG. 16, similar to Embodiment 9, on the upper face of a substrate 1, a gate electrode 2, a gate insulating film 3, an oxide semiconductor thin film 35, a hydrogenated amorphous silicon layer 9, an upper electrode 10, a second protective film 11, a second contact hole 17, a third contact hole 18, a bias line 12, a signal line 13, and a third protective film 14, are formed in the mentioned order from the below.

After the formation of the third protective film 14, an opening portion 19 is formed. The opening portion 19 is positioned right above the active region 34 and partly removes the second protective film 11 and the third protective film 14 such that the active region 34 is not exposed. However, the opening portion 19 is configured to have a position, a size, and a depth such that the hydrogenated amorphous silicon layer 9, the upper electrode 10, the gate line 20, the signal line 13, and the bias line 12 are not exposed. The position of the bottom of the opening portion 19 defines boundary lines of three regions (the source region 32, the drain region 33, and the active region 34) of the oxide semiconductor thin film 35(a). The characteristic of the thin film transistor is determined based on a distance at which the source region 32 and the drain region 33 are adjacent to each other through the active region 34. Accordingly, the width of the opening portion 19 defining the distance at which the source region 32 and the drain region 33 are adjacent to each other is limited to a distance (4 μm to 100 μm) from which a good transistor characteristic is acquired. The remaining film thickness of the protective film of the opening portion 19 is 1000 Å or less and is formed at least to be thinner than the second protective film 11 immediately after the film formation.

Similar to Embodiments 1 and 9, post-processing after the formation of the opening portion 19 is performed, and a fourth protective film 15 is formed. The configuration of a radiation imaging apparatus that is an application of Embodiment 10 is the same as that according to Embodiment 1.

Description of Effect of Embodiment 10

An effect according to the opening portion is the same as that according to Embodiment 1. An effect of not arranging the oxide semiconductor layer 4, the source electrode 5, the drain electrode 6, and the lower electrode 8 of the thin film transistor and, instead thereof, inserting the oxide semiconductor thin film 35 of one layer is the same as that according to Embodiment 9. A big difference from Embodiment 9, similar to Embodiment 5, the active region 34 is not exposed, and accordingly, the etching time can be shortened compared to that according to Embodiment 9, and damage according to the etching of the surface of the active region 34 and an adverse effect caused thereby can be reduced. In addition, regarding the depth of the opening portion according to the present invention, even in a case where the second protective film 11 of some elements is removed, or remaining film thicknesses of some elements are larger than those of the other elements to some degree due to the influence of more or less unbalance inside the face, a time for gas molecules used for the post-processing to penetrate into the oxide semiconductor is slightly changed, and a serious problem is not caused.

Embodiment 11

Configuration of Embodiment 11

Embodiments 11 to 15 relate to the shapes of an oxide semiconductor layer 4 of a thin film transistor, an etch stop layer 23, and an opening portion 19 seen from the front side and are independent from Embodiments 1 to 8 representing the cross-sectional structure seen from the side. In addition, contents illustrated in Embodiments 11 to 15 relate to positional relations among a gate electrode 2, a source electrode 5, a drain electrode 6, an oxide semiconductor layer 4, and an opening portion 19 and do not relate to Embodiments 9 and 10 in which the source electrode 5, the drain electrode 6, and the oxide semiconductor layer 4 are not present.

Embodiments 11 to 15 will be described with reference to not a cross-sectional view of a photodiode and a thin film transistor but a plan view of the thin film transistor. The cross-sectional structure of Embodiment 11 is assumed to be that according to Embodiment 1 (FIG. 3) or Embodiment 2 (FIG. 7).

Figure 17:
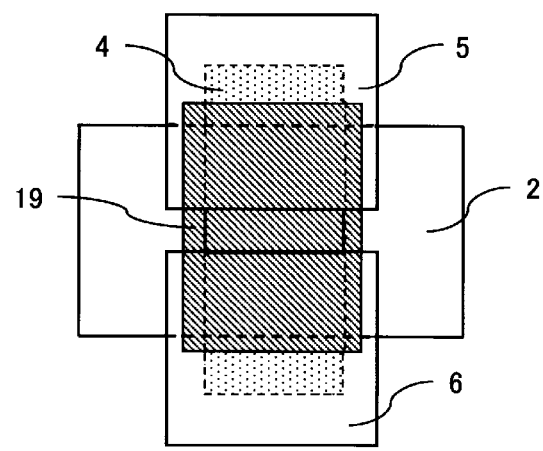
FIG. 17 is a plan view of a thin film transistor according to Embodiment 11 of the present invention and is an example applied to the case of a channel digging-type TFT as in Embodiment 1.

FIG. 17 is a plan view of a thin film transistor according to Embodiment 11 of the present invention and is an example applied to the case of a channel digging-type TFT as in Embodiment 1. An oxide semiconductor layer 4 is arranged on the right upper side of a gate electrode 2 with a gate insulating film interposed therebetween. The longitudinal direction (the horizontal direction in FIG. 17) of the gate electrode 2 and the longitudinal direction (the vertical direction in FIG. 17) of the oxide semiconductor layer 4 are orthogonal to each other. Each of the source electrode 5 and the drain electrode 6 is formed to have a width larger than the width of the oxide semiconductor layer 4 in the widthwise direction. At this time, the channel width is determined by the width of the oxide semiconductor layer 4 in the widthwise direction. The horizontal width of the opening portion 19 is longer than the channel width, and the width of the opening portion 19 in the vertical direction is longer than the channel length.

Figure 18:
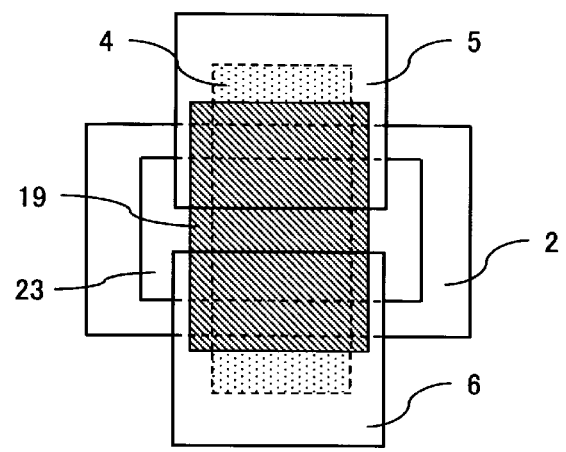
FIG. 18 is a plan view of another thin film transistor according to Embodiment 11 of the present invention and is an example applied to the case of a channel protecting-type TFT as in Embodiment 2.

FIG. 18 is a plan view of another thin film transistor according to Embodiment 11 of the present invention and is an example applied to the case of a channel protecting-type TFT as in Embodiment 2. Except for an etch stop layer 23, FIG. 18 is the same as FIG. 17. The etch stop layer 23 is positioned in an upper layer of the oxide semiconductor layer 4 and is arranged such that the longitudinal direction of the gate electrode 2 and the longitudinal direction of the etch stop layer 23 are parallel with each other. In addition, the etch stop layer 23 in the widthwise direction is shorter than the gate electrode 2 in the widthwise direction and is longer than a distance between the source electrode 5 and the drain electrode 6. The length of the etch stop layer 23 in the longitudinal direction is much larger than the width of the source electrode 5 and the drain electrode 6. The horizontal width of the opening portion 19 is longer than the horizontal width of the oxide semiconductor layer 4, and the width of the opening portion 19 in the vertical direction is longer than the channel length. In case of the channel protection type, since the channel length is determined by the etch stop layer 23, the width of the opening portion 19 in the vertical direction is larger than the length of the etch stop layer 23 in the widthwise direction.

Figure 19:
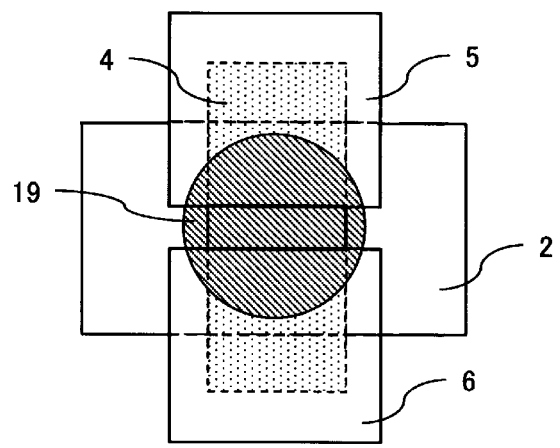
FIG. 19 is a plan view of a TFT having a circular opening portion according to Embodiment 11 of the present invention.

In Embodiment 11, the size of the opening portion 19 is of significance, and the shape thereof does not matter. FIG. 19 is a plan view of a TFT according to Embodiment 11 of the present invention in which the opening portion 19 has a circular shape. Thus, in FIG. 19, while the plan view of the thin film transistor according to Embodiment 11 in which the opening portion 19 has a circular shape is illustrated, an opening structure of which the vertical width is longer than the channel length, and the horizontal width is larger than the oxide semiconductor layer 4 belongs to Embodiment 11.

Description of Operation According to Embodiment 11

The process flow is the same as that of each of Embodiments 1 to 8.

Description of Effect of Embodiment 11

In Embodiment 11, the horizontal width of the opening portion 19 is larger than the oxide semiconductor layer 4 and thus has a shape from which the effect of characteristic enhancement is acquired the most. The reason for this is that the shape is a shape capable of processing the entirety of the oxide semiconductor between the source electrode 5 and the drain electrode 6 that is a path of the current. In other words, in the thin film transistor illustrated in FIG. 17, a current flowing between the source electrode 5 and the drain electrode 6 is required to traverse the oxide semiconductor layer 4 that is open and exposed. Particularly, in a thin film transistor in which oxide semiconductor, into which a large amount of hydrogen has been introduced, having very low resistance is used for the active layer, in a case where at least a part of the area that the current traverses has high resistance according to the formation of the opening portion 19 as illustrated in Embodiment 11 and the post-processing, a flowing Off-current is lower than that before the post-processing. In other words, in a case where the horizontal width of the opening portion 19 is smaller than that of the oxide semiconductor layer 4, and there is an area for which character enhancement using the post-processing cannot be performed even in a part, a current flowing between the source electrode 5 and the drain electrode 6 does not pass through an area having increased resistance according to the post-processing but passes through a low-resistance area that has not been post-processed, and accordingly, the Off current is almost the same before and after the post-processing.

Embodiment 12

Configuration of Embodiment 12

Embodiment 12 is a shape that is effective only in a case where Embodiments 3 and 4 are applied. For this reason, the cross-sectional structure according to Embodiment 12 is appropriate for Embodiment 3 (FIG. 8) or Embodiment 4 (FIG. 9).

Figure 20:
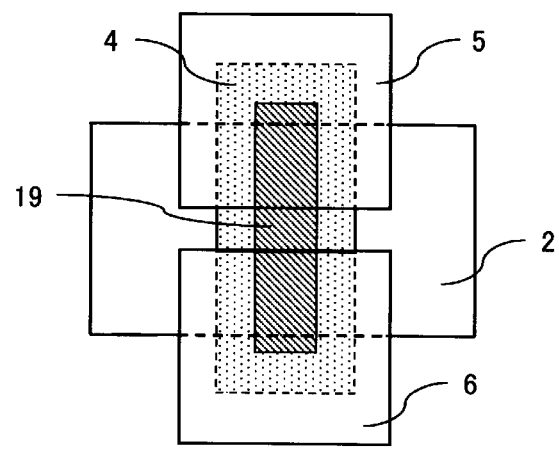
FIG. 20 is a plan view of a thin film transistor according to Embodiment 12 of the present invention and is an example applied to the case of a channel digging-type TFT as in Embodiment 1.
Figure 21:
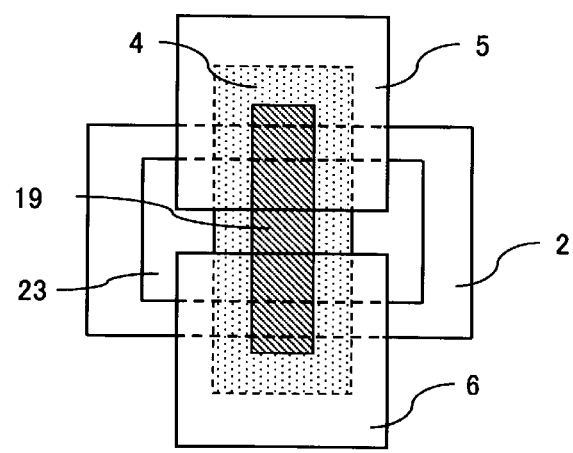
FIG. 21 is a plan view of another thin film transistor according to Embodiment 12 of the present invention and is an example applied to the case of a channel protecting-type TFT as in Embodiment 2.

FIG. 20 is a plan view of a thin film transistor according to Embodiment 12 of the present invention and is an example applied to the case of a channel digging-type TFT as in Embodiment 1. FIG. 21 is a plan view of another thin film transistor according to Embodiment 12 of the present invention and is an example applied to the case of a channel protecting-type TFT as in Embodiment 2. The cross-sectional structures are the same as those of Embodiments 3 and 4.

As a distinctive characteristic of this embodiment, different from Embodiment 11, the horizontal width of the opening portion 19 is smaller than the oxide semiconductor layer 4. Thus, since the cross-sectional structure is Embodiment 3 or 4, connection areas of the source electrode 5 and the drain electrode 6 with the oxide semiconductor layer 4 are smaller than the horizontal width of the oxide semiconductor layer 4. The width of the opening portion 19 in the vertical direction is assumed to be longer than the channel length and is shorter than the length of the oxide semiconductor layer 4 in the longitudinal direction. Accordingly, in Embodiment 12, only the oxide semiconductor layer 4 is exposed by the opening portion 19.

In Embodiment 10, the size of the opening portion 19 is of significance, and, in a case where the horizontal width of the opening portion 19 is smaller than the oxide semiconductor layer 4, and the opening portion 19 is configured to include the channel region and be large, the shape does not matter.

The configurations other than the opening portion 19 are the same as those of Embodiment 11 illustrated in FIG. 17 or 18.

Description of Operation According to Embodiment 12

The process flow is the same as that of each of Embodiments 3 and 4.

Description of Effect of Embodiment 12

First, when the plan structure according to Embodiment 11 is applied to the cross-sectional structure according to Embodiments 3 and 4, in order to open in a range wider than the horizontal width of the oxide semiconductor, in a case where there is no etching selectivity between the first protective film 7 to the third protective film 14 and the gate insulating film 3 at the time of forming the opening portion 19, the gate insulating film 3 disposed on the outer side of the oxide semiconductor is etched together with the formation of the opening portion 19, and there is concern that the gate electrode 2 is exposed depending on the situations. Particularly, in Embodiments 3 and 4, the source electrode 5 and the drain electrode 6 are formed after the opening, there is a risk of formation of a short circuit with the exposed gate electrode 2.

Thus, in Embodiment 12, the opening area is limited to the right upper side of the oxide semiconductor layer 4, and the gate insulating film 3 is configured to have a shape not to be etched. Accordingly, the formation of a short circuit between the gate electrode 2 and the source electrode 5 or the drain electrode 6 is suppressed, and a structure for enhancing the yield is formed.

However, as described in Embodiment 11, in a case where the post-processing for causing the oxide semiconductor layer 4 having low resistance to have high resistance is performed, a current flows through an area that has not been post-processed (not opened) as a new channel region, and the effect of the post-processing is not acquired, whereby Embodiment 12 is not practical.

Embodiment 13

Configuration of Embodiment 13

Embodiment 13 and subsequent embodiments have a shape that is effective only in a case where Embodiment 4 is applied. For this reason, unless otherwise mentioned, Embodiment 4 is appropriate for the cross-sectional structure according to Embodiments 13 and sequent embodiments.

Figure 22:
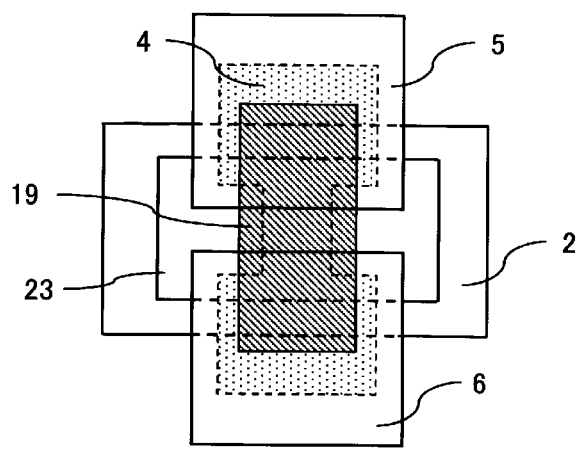
FIG. 22 is a plan view of a thin film transistor according to Embodiment 13 of the present invention.

FIG. 22 is a plan view of a thin film transistor according to Embodiment 13 of the present invention. As a distinctive characteristic of this embodiment, different from Embodiment 12, the oxide semiconductor layer 4 is throttled, and a structure is formed in which an opening portion 19 is wider than the horizontal width of the oxide semiconductor layer 4 partly between the source electrode 5 and the drain electrode 6. The vertical width of an area that is throttled is smaller than the width of the etch stop layer 23 in the widthwise direction.

The configurations other than the oxide semiconductor layer 4 are the same as those according to Embodiment 12 illustrated in FIG. 21.

Description of Operation According to Embodiment 13

The process flow is the same as that of Embodiment 4.

Description of Effect of Embodiment 13

As described in Embodiment 12, the opening area in which the oxide semiconductor layer 4 is not present may etch the gate insulating film 3, and there is a possibility of exposing the gate electrode 2. However, in case of Embodiment 4, by arranging the etch stop layer 23 at a position at which the gate insulating film 3 is exposed before the formation of the source electrode 5 and the drain electrode 6, the formation of a short circuit between the gate electrode 2 and the source electrode 5 and the drain electrode 6 can be avoided.

In addition, as in Embodiment 12, in a case where the horizontal width of the opening portion 19 is smaller than the horizontal width of the oxide semiconductor layer 4, there is a possibility that a current flows through an area that is not open, in other words, an area that has not post-processed as a path. Particularly, in a case where the oxide semiconductor layer 4 before the post-processing has low resistance, a current does not flow through the oxide semiconductor area that has been processed after the opening process so as to have high resistance, and accordingly, an effect of the characteristic enhancement is not acquired. Thus, as illustrated in FIG. 22, by figuring out the shape of the oxide semiconductor layer 4 and forming an area in which the opening portion 19 expands to the outer side of the oxide semiconductor layer 4 at least in a part, the effect of the characteristic recovery according to the opening and the post-processing can be sufficiently acquired.

In addition, a method of configuring the horizontal width of the opening portion 19 to be larger than the horizontal width of the oxide semiconductor layer 4 with the exposed portion of the gate electrode 2 hidden by the etch stop layer 23 may be attained by figuring out the shape of the opening portion 19 or the etch stop layer 23 other than the oxide semiconductor layer 4.

Embodiment 14

Configuration of Embodiment 14

Figure 23:
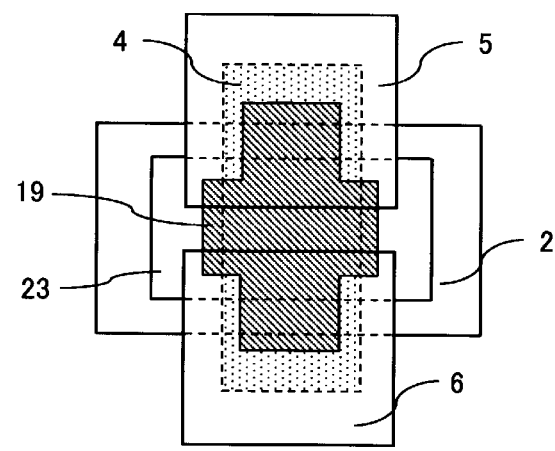
FIG. 23 is a plan view of a thin film transistor according to Embodiment 14 of the present invention.

FIG. 23 is a plan view of a thin film transistor according to Embodiment 14 of the present invention. A distinctive characteristic of this embodiment, different from Embodiment 13, is an example of the structure described immediately above in which the shape of the opening portion 19 is figured out such that the horizontal width of the opening portion 19 is larger than the horizontal width of the oxide semiconductor layer 4 while the exposed portion of the gate electrode 2 is hidden by the etch stop layer 23. The configurations other than the opening portion 19 are the same as those according to Embodiment 10 illustrated in FIG. 21.

Description of Operation According to Embodiment 14

The process flow is the same as that of Embodiment 4.

Description of Effect of Embodiment 14

The effects according to Embodiment 14 are the same as those according to Embodiment 13.

Embodiment 15

Configuration of Embodiment 15

Figure 24:
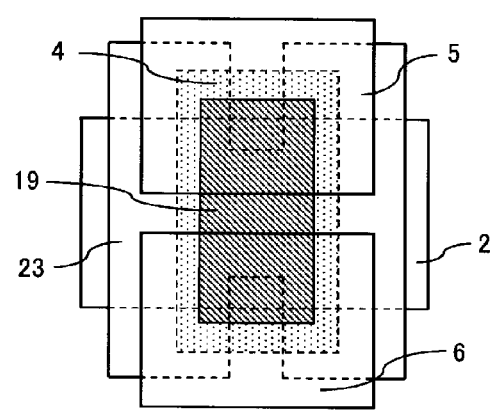
FIG. 24 is a plan view of a thin film transistor according to Embodiment 15 of the present invention.

FIG. 24 is a plan view of a thin film transistor according to Embodiment 15 of the present invention. A distinctive characteristic of this embodiment, different from Embodiments 13 and 14, is an example of the structure described in connection with FIG. 23 in which the shape of the etch stop layer 23 is figured out such that the horizontal width of the opening portion 19 is larger than the horizontal width of the oxide semiconductor layer 4 while the exposed portion of the gate electrode 2 is hidden by the etch stop layer 23. The configurations other than the opening portion 19 are the same as those according to Embodiment 12 illustrated in FIG. 21.

Description of Operation According to Embodiment 15

The process flow is the same as that of Embodiment 4.

Description of Effect of Embodiment 15

The effects according to Embodiment 15 are the same as those according to Embodiment 13.

Finally, the structures of a gate terminal portion and a signal or bias terminal portion (wiring terminal portion) and manufacturing method thereof in Embodiments 1 to 15 will be described.

Figure 25:
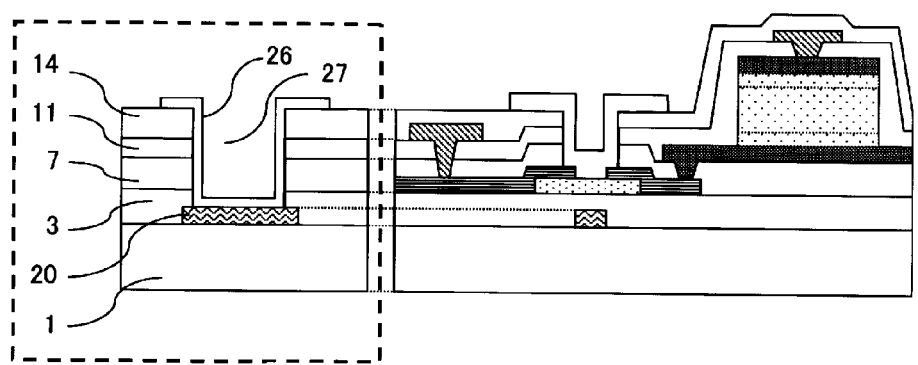
FIG. 25 is a cross-sectional view that illustrates the structure of a gate terminal portion according to the present invention.

First the structure of the gate terminal portion will be described. FIG. 25 is a cross-sectional view (inside broken lines) that illustrates the structure of the gate terminal portion according to the present invention. For easy understanding, the element structure of the photodiode according to Embodiment 1 is represented together.

The gate terminal portion according to the present invention is disposed by simultaneously opening the gate insulating film 3, the first protective film 7, the second protective film 11, and the third protective film 14 disposed in the upper layer of the gate line 20 and forming a first terminal pad 26 on this opening (first terminal contact 27) at the time of forming the opening portion 19.

The first terminal pad 26 is connected to the gate line 20 through the first terminal contact 27, and the gate line 20 is connected to the gate electrode 2 of the thin film transistor. Accordingly, a signal transmitted from a gate driver (not illustrated in the drawing) is supplied to the gate electrode 2 of the thin film transistor through the gate terminal portion and the gate line 20.

Next, a method of manufacturing the gate terminal portion will be described. As illustrated in FIG. 25, similar to Embodiment 1, a gate line 20, a gate insulating film 3, a first protective film 7, a second protective film 11, a third protective film 14 are sequentially formed on a substrate 1. The gate line 20 is formed simultaneously with the gate electrode 2.

After the formation of the third protective film 14, the opening portion 19 and the first terminal contact 27 are simultaneously open. The first terminal contact 27 is positioned right above the gate line 20 and partly opens the gate insulating film 3 to the third protective film 14 so as to expose the gate line 20.

After the formation of the first terminal contact 27, the post-processing described above is performed.

After the post-processing is performed, the fourth protective film 15 is formed, and the fourth protective film 15 is removed without being left on the first terminal contact 27.

After the formation of the fourth protective film 15, the first terminal pad 26 is formed to cover the gate line 20. The first terminal pad 26 is formed to have low connection resistance with the gate line 20 by using a transparent conductive film of ITO or the like and a metal material such as Al.

In this way, by simultaneously forming the opening portion 19 and the first terminal contact 27, the number of processes can be decreased by one in the terminal portion forming process.

Figure 26:
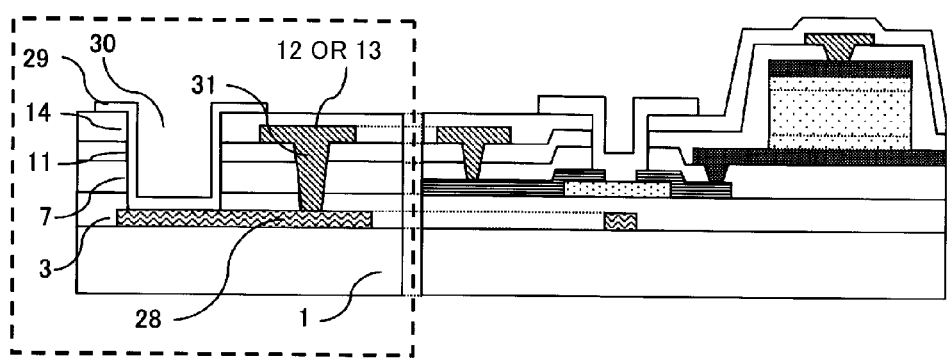
FIG. 26 is a cross-sectional view of a signal terminal portion or a bias terminal portion according to the present invention.

Next, the structure of the signal terminal portion or the bias terminal portion will be described. FIG. 26 is a cross-sectional view (inside broken lines) that illustrates the structure of a signal terminal portion or a bias terminal portion according to the present invention. For easy understanding, the element structure of the photodiode according to Embodiment 1 is represented together.

The signal terminal portion or the bias terminal portion according to the present invention is disposed by simultaneously opening the gate insulating film 3, the first protective film 7, the second protective film 11, and the third protective film 14 disposed in the upper layer of a gate layer converting portion 28 and forming a second terminal pad 29 on this opening (second terminal contact 30) at the time of forming the opening portion 19.

The second terminal pad 29 is connected to the gate layer converting portion 28 through the second terminal contact 30, and the gate layer converting portion 28 is connected to the bias line 12 or the signal line 13 through the fourth contact hole 31. Accordingly, a bias voltage is supplied to the upper electrode 10 of the photodiode through the bias terminal portion and the bias line 12, and electric charge generated by the photodiode is input to an electric charge detecting circuit (not illustrated in the drawing) through the signal line 13 and the signal terminal portion and is read.

Next, a method of manufacturing the signal terminal portion or the bias terminal portion will be described. As illustrated in FIG. 26, similar to Embodiment 1, a gate layer converting portion 28, a gate insulating film 3, a first protective film 7, and a second protective film 11 are sequentially formed on a substrate 1. The gate layer converting portion 28 is formed simultaneously with the gate electrode 2.

After the formation of the second protective film 11, a fourth contact hole 31 used for connecting the gate layer converting portion 28 and a bias line 12 or a signal line 13 to be formed later is formed simultaneously with second and third contact holes 17 and 18. The fourth contact hole 31 is formed in a part of the gate insulating film 3, the first protective film 7, and the second protective film 11 disposed right above the gate layer converting portion 28.

Thereafter, the bias line 12 and the signal line 13 are formed, and a third protective film 14 is further formed. After the formation of the third protective film 14, the opening portion 19 and the second terminal contact 30 are simultaneously open. The second terminal contact 30 is positioned on the right upper side of the gate layer converting portion 28 and partly opens the gate insulating film 3 to the third protective film 14 so as to expose the gate layer converting portion 28.

After the formation of the second terminal contact 30, the post-processing described above is performed. After the post-processing is performed, a fourth protective film 15 is formed, and the fourth protective film 15 is removed without being left on the second terminal contact 30.

After the formation of the fourth protective film 15, a second terminal pad 29 is formed so as to cover the gate layer converting portion 28. The second terminal pad 29 is formed to have low connection resistance with the gate layer converting portion 28 by using a transparent conductive film of ITO or the like and a metal material such as Al.

In this way, by simultaneously forming the opening portion 19 and the second terminal contact 30, the number of processes can be decreased by one in the terminal portion forming process.

Figure 27:
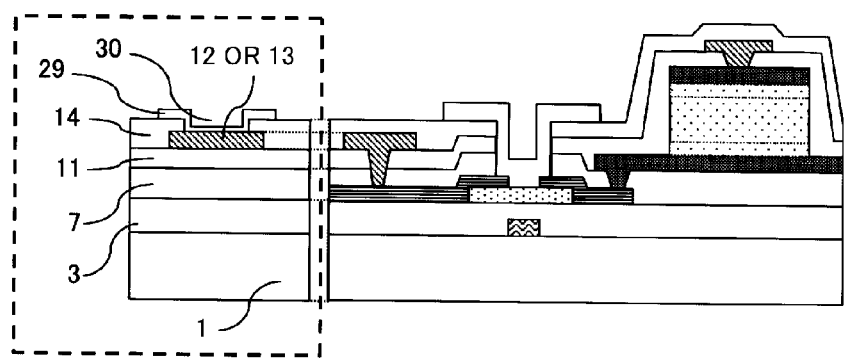
FIG. 27 is a cross-sectional view of a bias terminal portion or a signal terminal portion of a photodiode array for describing the effect of a terminal portion structure according to the present invention.

FIG. 27 is a cross-sectional view of the bias terminal portion or the signal terminal portion of a photodiode array for describing the effect of a terminal portion structure according to the present invention.

Here, since the bias line 12 or the signal line 13 is positioned in an upper layer than the layer of the gate line 20, by forming the terminal portion structure as illustrated in FIG. 27 in which only the third protective film 14 disposed on the right upper side of the bias line 12 or the signal line 13 is open, the deep opening portion 19 and the swallow second terminal contact 30 are simultaneously etched, and the surface of the bias line 12 or the signal line 13 disposed right below the second terminal contact 30 is damaged by etching, and degradation of a connection resistance with the second terminal pad, and a metal loss or the bias line 12 or the signal line 13, and the like may occur. Accordingly, as illustrated in FIG. 26, the gate layer converting portion 28 is arranged and is connected to the bias line 12 or the signal line 13 through the fourth contact hole 31, and the second terminal contact 30 is configured to have a depth of the same degree as that of the opening portion 19, whereby the process can be easily managed, and the degradation in the yield according to high resistance of the terminal portion can be suppressed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. A semiconductor device comprising: a thin film transistor including: an oxide semiconductor layer that is formed in an island shape and contains at least one or more elements among indium, gallium, zinc, and tin and oxygen; a source and a drain that are connected to the oxide semiconductor layer; a protective film with an insulating property of at least one or more layers that is formed in an upper layer of the oxide semiconductor layer; and an opening portion that is disposed in the protective film and has a position and a size for including a channel region or a back channel region of the oxide semiconductor layer, the position and the size overlapping the source and the drain; and a photodiode that is disposed in an upper layer upper than the oxide semiconductor layer of the thin film transistor and includes a hydrogenated amorphous silicon wherein a portion of the protective film with the insulating property under the opening portion directly contacts the oxide semiconductor layer, the source, and the drain.

2. The semiconductor device according to claim 1, wherein a film thickness of the hydrogenated amorphous silicon layer is 0.5 μm or more.

3. The semiconductor device according to claim 1, wherein the thin film transistor further includes:

an etch stop layer that is directly arranged right above the channel region or the back channel region of the oxide semiconductor layer; and the source and the drain that are respectively formed using metal so as to be in contact with and overlap the etch stop layer and the oxide semiconductor layer.

4. The semiconductor device according to claim 3, wherein, in the opening portion, a protective film of a lowermost layer among the protective films of at least one or more layers is open up to the middle in a film thickness direction, and the etch stop layer is not exposed.

5. The semiconductor device according to claim 3, wherein, in the opening portion, the etch stop layer is exposed.

6. The semiconductor device according to claim 1, wherein the source and the drain of the thin film transistor are configured in a same layer as the oxide semiconductor layer, are configured as films having a same composition, and have resistivity lower than the channel region or the back channel region, and wherein an n-type hydrogenated amorphous silicon layer of the hydrogenated amorphous silicon layer of the photodiode is in contact with the source of the oxide semiconductor layer.

7. The semiconductor device according to claim 1, wherein, in the opening portion, a protective film of a lowermost layer among the protective films of at least one or more layers is open up to the middle in a film thickness direction, and the oxide semiconductor layer is not exposed.

8. The semiconductor device according to claim 1, wherein, in the opening portion, the channel region or the back channel region of the oxide semiconductor layer is exposed.

9. The semiconductor device according to claim 1, wherein the source and the drain are connected to the oxide semiconductor layer through the opening portion.

10. The semiconductor device according to claim 1, wherein the source and the drain are disposed in a lower layer lower than the oxide semiconductor layer.

11. A photodiode array in which a plurality of the semiconductor devices according to claim 1 are aligned in vertical and horizontal directions so as to be arranged in a matrix pattern.

12. An imaging apparatus in which the photodiode array according to claim 11 is mounted.

13. A semiconductor device comprising: a thin film transistor including: an oxide semiconductor layer that is formed in an island shape and contains at least one or more elements among indium, gallium, zinc, and tin and oxygen; a source and a drain that are connected to the oxide semiconductor layer; a protective film with an insulating property of at least one or more layers that is formed in an upper layer of the oxide semiconductor layer; and an opening portion that is disposed in the protective film and has a position and a size for including a channel region or a back channel region of the oxide semiconductor layer; and a photodiode that is disposed in an upper layer upper than the oxide semiconductor layer of the thin film transistor and includes a hydrogenated amorphous silicon layer, wherein the protective film provided with the opening portion is formed in an upper layer higher than the source and the drain, and wherein a portion of the protective film with the insulating property under the opening portion directly contacts the oxide semiconductor layer, the source, and the drain.

14. A semiconductor device comprising: a thin film transistor including: an oxide semiconductor layer that is formed in an island shape and contains at least one or more elements among indium, gallium, zinc, and tin and oxygen; a source and a drain that are connected to the oxide semiconductor layer; a protective film with an insulating property of at least one or more layers that is formed in an upper layer of the oxide semiconductor layer; and an opening portion that is disposed in the protective film and has a position and a size for including a channel region or a back channel region of the oxide semiconductor layer; and a photodiode that is disposed in an upper layer upper than the oxide semiconductor layer of the thin film transistor and includes a hydrogenated amorphous silicon layer, wherein the protective film of at least one layer among the protective film provided with the opening portion is formed in an upper layer higher than the photodiode, and wherein a portion of the protective film with the insulating property under the opening portion directly contacts the oxide semiconductor layer, the source, and the drain.

15. A semiconductor device comprising: a thin film transistor including: an oxide semiconductor layer that is formed in an island shape and contains at least one or more elements among indium, gallium, zinc, and tin and oxygen, a source and a drain that are connected to the oxide semiconductor layer, and a first protective film with an insulating property of at least one or more layers that is formed in an upper layer of the oxide semiconductor layer; and a photodiode that is disposed in an upper layer upper than the oxide semiconductor layer of the thin film transistor and includes a hydrogenated amorphous silicon layer, wherein the semiconductor device comprises: a second protective film with an insulating property of at least one or more layers that is formed in an upper layer of the thin film transistor and the photodiode; and an opening portion that is disposed in the first protective film and the second protective film, and has a position and a size for including a channel region or a back channel region of the oxide semiconductor layer, the position and the size overlapping the source and the drain, and wherein a portion of the first protective film with the insulating property under the opening portion directly contacts the oxide semiconductor layer, the source, and the drain.

16. The semiconductor device according to claim 15, wherein the oxide semiconductor layer is formed by reforming the oxide semiconductor layer altered by the formation of the hydrogenated amorphous silicon layer as a film, by processing of reforming the altered oxide semiconductor layer after the formation of the hydrogenated amorphous silicon layer as a film.

* * * * *